(12) United States Patent
Muramatsu et al.

(10) Patent No.: US 7,973,245 B2
(45) Date of Patent: *Jul. 5, 2011

(54) WIRING BOARD AND CAPACITOR TO BE BUILT INTO WIRING BOARD

(75) Inventors: Masaki Muramatsu, Komaki (JP); Shinji Yuri, Kasugai (JP); Kazuhiro Urashima, Kounan (JP); Hiroshi Yamamoto, Aichi (JP); Toshitake Seki, Aichi (JP); Motohiko Sato, Aichi (JP)

(73) Assignee: NGK Spark Plug Co., Ltd., Nagoya, Aichi (JP)

( * ) Notice: Subject to any disclaimer, the term of this patent is extended or adjusted under 35 U.S.C. 154(b) by 536 days.

This patent is subject to a terminal disclaimer.

(21) Appl. No.: 12/026,838

(22) Filed: Feb. 6, 2008

(65) Prior Publication Data

US 2008/0223607 A1 Sep. 18, 2008

Related U.S. Application Data

(62) Division of application No. 11/350,285, filed on Feb. 9, 2006, now Pat. No. 7,345,246.

(30) Foreign Application Priority Data

| Feb. 9, 2005 | (JP) | 2005-033558 |
| Feb. 9, 2005 | (JP) | 2005-033559 |
| Jul. 12, 2005 | (JP) | 2005-203181 |

(51) Int. Cl.
  *H05K 1/16* (2006.01)
(52) U.S. Cl. ...................... 174/260; 174/261
(58) Field of Classification Search .......... 174/260–262; 361/761–763

See application file for complete search history.

(56) References Cited

U.S. PATENT DOCUMENTS 6,351,369 B1 * 2/2002 Kuroda et al. ............. 361/306.3
(Continued)

FOREIGN PATENT DOCUMENTS

JP 4-357806 12/1992
(Continued)

OTHER PUBLICATIONS

Japan Patent Office, Notification of Reasons for Refusal (Office Action), JP Patent Application No. 2006-191442, Dispatch date: Jul. 13, 2010.

(Continued)

*Primary Examiner* — Ishwarbhai B Patel
(74) *Attorney, Agent, or Firm* — Stites & Harbison PLLC; Jeffrey A. Haeberlin; Stephen J. Weyer

(57) ABSTRACT

An intermediate board has a board core formed by a main core body and a sub-core portion. The main core body has a plate-like shape and includes an open sub-core housing portion in which the sub-core portion is housed. A first terminal array of the board core has an area that overlaps an orthogonal projection of the sub-core portion. The latter incorporates a laminated ceramic capacitor formed by first and second conductor layers with a ceramic (dielectric) layer therebetween. The first layer is connected to first and second side terminals of a first type while the second layer is connected to first and second side terminals of a second type. The housing portion has an inner edge which, in cross section, is of a quadrate shape, and a radius portion is formed at each corner having a dimension of between 0.1 and 2 mm.

5 Claims, 18 Drawing Sheets

U.S. PATENT DOCUMENTS

| | | | |
|---|---|---|---|
| 6,721,153 B2 * | 4/2004 | Naito et al. | 361/100 |
| 6,734,534 B1 | 5/2004 | Vu et al. | |
| 7,078,788 B2 | 7/2006 | Vu et al. | |
| 7,345,246 B2 * | 3/2008 | Muramatsu et al. | 174/260 |
| 2002/0020898 A1 | 2/2002 | Vu et al. | |
| 2005/0062173 A1 | 3/2005 | Vu et al. | |

FOREIGN PATENT DOCUMENTS

| | | |
|---|---|---|
| JP | 10-107439 | 4/1998 |
| JP | 2002-124749 | 4/2002 |
| JP | 2002-246506 | 8/2002 |
| JP | 2003-309207 | 10/2003 |
| JP | 2004-146495 | 5/2004 |
| JP | 2004-172305 | 6/2004 |
| JP | 2004-530285 | 9/2004 |
| JP | 2005-019572 | 1/2005 |

OTHER PUBLICATIONS

Japan Patent Office, Notification of Reasons for Refusal (Office Action), JP Patent Application No. 2006-033080, Dispatched on Apr. 21, 2011.

* cited by examiner

○ : Signal terminal
● : Power terminal
◉ : Ground terminal

WIRING BOARD AND CAPACITOR TO BE BUILT INTO WIRING BOARD

CROSS REFERENCE TO RELATED APPLICATIONS

This application is a divisional of application Ser. No. 11/350,285 filed Feb. 9, 2006 now U.S. Pat. No. 7,345,246 (which is hereby incorporated by reference).

TECHNICAL FIELD

The present invention relates to a wiring board and to a capacitor to be built into the wiring board.

RELATED BACKGROUND ART

In recent years, semiconductor integrated circuit elements such as CPUs, and other LSIs which operate at high speeds, have been made increasingly smaller in size, and thus the number of signal terminals, power source terminals and/or ground terminals has increased, and the distance between terminals has been reduced. A popular technique involves the provision of a terminal array comprising an integrated circuit wherein a large number of terminals are connected to a mother board using so-called flip-chip connections. However, the gaps between terminals differ greatly for the terminal array of the integrated circuit as compared with the terminal array on the mother board. Because of this, an intermediate wiring board is required in eliminating this difference in the terminal spacing.

So-called organic package boards in such intermediate boards have laminated wiring portions comprising alternate dielectric layers and conductor layers made of macromolecular material, and include a terminal array for flip-chip connection arranged on a first main surface formed by the dielectric layer of the laminated wiring portion. The laminated wiring portion is formed on a board core which is principally made of macromolecular material such as an epoxy resin reinforced by glass fiber. When the terminal gap on the IC side is greatly different from the terminal gap on the side of the main board (mother board) to which the IC side is to be connected, the wiring needed for conversion, and the pattern of the connecting vias, tend to be quite small and complicated as the number of terminals involved increases. However, organic package boards have the advantage that the miniaturized and complicated wiring pattern required can be formed easily, with high definition, using a combination of photolithography and plating.

On the other hand, in such organic package boards the main board (for example, a mother board) to which connections are to be made is principally made of a macromolecular material, and, further, the organic package boards are principally made of a macromolecular material. For this reason, if the heat history, such as soldering reflow, is considered, the difference in the linear coefficient of expansion between a semiconductor integrated circuit element which is principally made of silicon (having a linear coefficient of expansion of, for example, 2 to 3 ppm/° C.) and the main board (having a linear coefficient of expansion of, for example, 17 to 18 ppm/° C.) is not sufficiently absorbed. This difference can potentially cause a defect such as peeling of the solder.

Japanese Patent Application Laid-Open No. 2001-035966 discloses a ceramic package board where a chief material used in making the board is a ceramic. When such a ceramic package board is used, the large gap in the linear coefficient of expansion between the semiconductor integrated circuit element and the main board to be flip-chip connected thereto is decreased, thereby effectively preventing the problem discussed above and, more particularly, effectively preventing a defect such as a break due to thermal stress in a soldered joint between the semiconductor integrated circuit element and the terminals.

However, with ceramic package boards, because the wiring portion is formed by using printing and calcining of a metal paste, it is more difficult to miniaturize the wiring portion, and to thus provide a highly integrated wiring board, than with organic package boards which, as noted above, can be made using lithography techniques. Thus, the amount of reduction in the terminal gaps on the side of the semiconductor integrated circuit element is limited.

A multistage board connecting structure, wherein a first intermediate board comprised of an organic package board is connected to a main board, a second "relay" board made of ceramic is connected to the first intermediate board, and a semiconductor integrated circuit element is connected to the second "relay" board, is also a potential candidate for this application. However, with this structure, it is difficult to comply with the very small size requirement because the dimension of the board connecting structure in the heightwise direction is increased by the increase in the number of the intermediate boards. Moreover, the number of connecting steps required is also increased. For this reason, the multistage board connecting structure is not an attractive candidate for this application.

SUMMARY OF THE INVENTION

It is an object of the present invention to provide a wiring board wherein disconnections or the like due to thermal stress are substantially eliminated, the height of the entire board connecting structure is reduced and the number of connecting steps needed is also reduced.

Further, it is another object of the present invention to provide a capacitor adapted to be built into the wiring board.

In order to solve the problems discussed in the previous section, a wiring board in accordance with a first aspect the present invention includes:

a board core comprising a main core body of a plate-like or planar shape and comprised of a macromolecular material (it being understood that the term "a macromolecular material" includes a material which is compounded with a filler such as ceramic fiber or particles) and a sub-core portion, the main core body including formed therein, a sub-core housing portion which is open at least one end, the sub-core portion being of a plate-like or planar shape and comprising a material with a smaller linear coefficient of expansion than that of the mail core body, said sub-core portion being housed in the sub-core housing portion and having a thickness matching that of the core main body;

a filling coupled portion, comprised of a macromolecular material, disposed so as to fill a gap between an inner peripheral surface of the sub-core housing portion and an outer peripheral surface of the sub-core portion;

a first terminal array formed on a first main surface of the board core, and comprised of a first side first type terminal and a first side second type terminal, one said terminal serving as a power source terminal and the other said terminal serving as a ground terminal, and said first terminal array further including a first side signal terminal; and a second terminal array formed on a second main surface of the board core, and comprised of a second side first type terminal and a second side second type terminal which are conductively connected to the first side first type terminal and the first side second type terminal, respectively, and a second side signal terminal which is conductively connected to the first side signal terminal, the first terminal array being disposed in a position wherein the first terminal array overlaps a resultant projected area of the sub-core portion produced by an orthogonal geometric projection of the sub-core portion onto a reference surface parallel to a planar surface of the board core;

the sub-core portion incorporating a laminated capacitor comprising a first electrode conductor layer conductively connected to the first side first type terminal and the second side first type terminal, a second electrode conductor layer which is conductively connected to the first side second type terminal and the second side second type terminal, and a dielectric layer disposed between first and second electrode conductor layers;

the sub-core housing portion having an inner peripheral edge of a cross section in a plane parallel to the planar surface of the sub-core portion of a quadrate shape with four corners, and having at the corners thereof a radius portion or a chamfered portion of dimensions between about 0.1 mm and 2 mm.

A wiring board in accordance with a second aspect of the invention includes:

a board core comprising a mail core body of a plate-like shape having a planar surface and comprised of a macromolecular material (it again being understood that the term "macromolecular material" includes a material incorporating a filler such as ceramic fiber or particles) and a sub-core portion, the main core body including a sub-core housing portion which is open at least one end, the sub-core portion being of a plate-like shape and comprising a material with a smaller linear coefficient of expansion than that of the main core body and being housed in the sub-core housing portion, said sub-core portion having a thickness matched to that of the main core body;

a filling coupled portion comprised of a macromolecular material and disposed so as to fill a gap between an inner peripheral surface of the sub-core housing portion and an outer peripheral surface of the sub-core portion;

a first terminal array, formed on a first main surface of the board core, comprised of a first side first type terminal and a first side second type terminal, one said terminal serving as a power source terminal and the other said terminal serving as a ground terminal, and the first terminal array further comprising a first side signal terminal; and a second terminal array, formed on a second main surface of the board core, comprised of a second side first type terminal and a second side second type terminal which are conductively connected to the first side first type terminal and the first side second type terminal, respectively, and a second side signal terminal which is conductively connected to the first side signal terminal, the first terminal array being disposed in a position wherein the first terminal array overlaps a resultant projected area of the sub-core portion produced by an orthogonal geometric projection of the sub-core portion onto a reference surface parallel to a planar surface of the board core, the sub-core portion incorporating a laminated capacitor comprising a first electrode conductor layer which is conductively connected to the first side first type terminal and the second side first type terminal, a second electrode conductor layer which is conductively connected to the first side second type terminal and the second side second type terminal, and a dielectric layer disposed between the first and second electrode conductor layers; and the sub-core housing portion having an inner peripheral edge of a cross section in a plane parallel with the planar surface of the sub-core portion comprising only a curved portion with a radius of curvature of not less than 0.1 mm and of a convex outward curvature.

According to these constructions, the sub-core portion, which is made of a material with a smaller linear coefficient of expansion than that of the main core body (which is made of macromolecular material), is embedded into, or received in, the board core so as to overlap the area of the first terminal array to be flip-chip connected to a semiconductor integrated circuit element. Because of this, any difference in the linear coefficient of expansion between the terminals in the first terminal array and the semiconductor integrated circuit element can be significantly reduced, and thus disconnection or the like due to thermal stress can be largely suppressed. Because the sub-core portion corresponding to a second wiring board is embedded into the main core body corresponding to a first wiring board, the overall height of the entire connecting structure between the semiconductor integrated circuit element and a main board using the wiring boards is decreased, and the number of connecting steps required is reduced.

The capacitor, which serves as a decoupling capacitor (or pass capacitor), can be directly connected to the semiconductor element in a form of the wiring board, so that the decoupling capacitor can be located close to the semiconductor element. As a result, the length of the wiring connection between the power source terminal and the decoupling capacitor is shortened, and because the inductance of the capacitor terminal portion is reduced, the impedance of the decoupling capacitor is lowered. Because the decoupling capacitor is incorporated into the wiring board, it is not necessary to provide the decoupling capacitor as a separate, discrete element on a rear surface of the main board, so that the number of parts is reduced and/or the size of the device is decreased.

In the preferred constructions of the present invention, the sub-core portion and the main core body are coupled by a filling coupled portion made of a macromolecular material that fills the gap between the inner peripheral surface of the sub-core housing portion and the outer peripheral surface of the sub-core portion. When each of the inner edge corners of the sub-core housing portion forms a right angle, i.e., a 90° corner (or a so-called pin corner), the corresponding filling coupled portion also has a projecting right angle at each of its four corners corresponding to those of the sub-core housing portion. When the sub-core housing portion is filled with the filling coupled portion and the filling coupled portion is solidified using a liquid macromolecular material, fine air bubbles are occasionally formed near the projecting corners. Moreover, a crack occasionally occurs near the projecting corners of the filling coupled portion during a heat cycle test or the like. When such a crack and/or air bubbles occur, the adhesion between the sub-core portion and the filling coupled portion deteriorates, thereby producing a break in the wiring boards and hindering the formation of a build-up resin insulating layer to be provided on the main core body and the sub-core portion.

To overcome these problems, according to the first aspect of the first invention, a curved surface corresponding to the radius surface of the sub-core housing portion or a shaped surface corresponding to the chamfered portion is also formed on the projecting corners of the filling coupled portion. With this construction, essentially no air bubbles are formed in the macromolecular material near the projecting corners, and concentration of stress is avoided even taking into consideration the temperature history of the device, so that the occurrence of cracks is unlikely. The adhesion between the sub-core portion and the filling coupled portion is, therefore, maintained, and defects such as those wherein the wiring boards are accidentally broken or wherein the formation of the build-up resin insulating layer is hindered can be effectively prevented.

When the dimension (radius of curvature) of the radius portion or the dimension of the chamfered portion (the chamfering dimension in the longitudinal direction of the wiring board) is less than 0.1 mm, the projecting corners of the filling coupled portion become too narrow, and air bubbles and cracking can easily occur. On the other hand, when the dimension of the radius portion or the chamfered portion exceeds 2 mm, the construction is ineffective in preventing the above-mentioned defects.

According to the second aspect of the present invention, the inner edge of the sub-core housing portion is comprised of only a curved portion with a radius of curvature of not less than 0.1 mm and of convex outward curvature. Because of this construction, residual bubbles or the like, which readily occur with the projecting corners of the prior art, are minimized or eliminated with respect to the filling coupled portion and the concentration of stress is essentially avoided even if the temperature history is taken into account, so that cracking or the like are largely prevented. The firm adhesion between the sub-core portion and the filling coupled portion is, therefore, retained, and thus defects such as the wiring boards being accidentally broken and hindrance of the formation of the build-up resin insulating layer are effectively prevented.

In the second aspect of the invention, the provision that the inner edge of the inner edge of the sub-core housing portion is comprised only of the curved portion with a radius of curvature of not less than 0.1 mm and of convex outward curvature is equivalent to providing a curved portion with a radius of curvature of less than 0.1 mm and is eliminated from configurational components of the inner edge of the sub-core housing portion. It is to be understood that providing a curved portion with radius of curvature of less than 0.1 mm includes a pin corner portion with a radius of curvature of less than 0.1 mm. It is noted that the second aspect of the invention is particularly effective when the inner peripheral edge of the cross section of the sub-core housing portion is of a substantially circular shape.

Other features and requirements which can be added to, and are common between, the first and second aspects of the present invention are discussed below.

In the sub-core portion, the outer peripheral edge of the cross section thereof in a plane parallel to a planar surface of the sub-core portion can have a quadrate shape, and a radius portion or a chamfered portion with a dimension of between 0.1 mm and 2 mm can be formed on the corners thereof. When the corners of the sub-core portion are so-called pin corners, back stress from the sub-core portion readily concentrates in the corners of the filling coupled portion at the time of adding temperature history, and thus occasionally, cracking can easily occur. Further, cracking easily occurs on the filling coupled portion from the corner ends of the sub-core portion. When, however, the aforementioned radius portion or chamfered portion is formed at the corners of the sub-core portion, the concentration of stress at the corners of the filling coupled portion is more easily suppressed. Moreover, the occurrence of cracking originating from the corner ends of the sub-core portion can also be effectively suppressed.

In one preferred embodiment, the first terminal is disposed in a position wherein the first terminal array is entirely included within a resultant projected area of the sub-core portion produced by an orthogonal geometric projection of the sub-core portion onto a reference surface parallel to a planar surface of the board core. According to this construction, the sub-core portion, the dimensions of which are adjusted so that the entire first terminal array to be flip-chip connected to the semiconductor integrated circuit element is included therein, is embedded into the board core. As a result of this, the difference in linear coefficient of expansion between all of the terminals in the first terminal array and the semiconductor integrated circuit element can be significantly reduced, and thus, disconnection or the like, due to thermal stress, can be further suppressed.

Because the sub-core portion corresponding to the second wiring board is embedded into the main core body corresponding to the first wiring board, the overall height of the entire connected structure of the semiconductor integrated circuit element and the main board using the intermediate boards can be decreased, and the number of connecting steps required can be reduced.

A capacitor which serves as a decoupling capacitor (or pass capacitor) can be directly connected to the semiconductor element in the form of the intermediate board, and thus the decoupling capacitor can be disposed close to the semiconductor element. As a result, a length of the wiring connection between the power source terminal and the decoupling capacitor terminal can be shortened, and the inductance of the capacitor terminal can be reduced, thereby contributing to a lowering of the impedance of the decoupling capacitor. Further, because the decoupling capacitor is incorporated into the intermediate board, it is not necessary to provide the decoupling capacitor as separate discrete element on a rear surface of the main board, thereby reducing the number of parts required and reducing the size of the device. These effects are particularly remarkable when the sub-core portion has an area that is equivalent to or larger than that of the forming area of the first terminal array.

The material or materials used in making the sub-core portion can be chosen from a number of candidate materials so long as the linear coefficient of expansion thereof is smaller than that of the main core body. However, given that the linear coefficient of expansion of the macromolecular material used is comparatively high, it is preferred that the sub-core portion comprise a ceramic sub-core portion principally made of a ceramic material, from the viewpoint that this embodiment will greatly reduce the difference in linear coefficient of expansion between the sub-core portion and the semiconductor integrated circuit element.

In this embodiment, examples of ceramic materials for the sub-core portion include alumina (7 to 8 ppm/° C.) and a glass ceramic (preferably, a composite material wherein 40 to 60 parts by weight of an inorganic ceramic filler such as alumina are added to borosilicate glass or lead borosilicate glass). The former has a relatively small linear coefficient of expansion in various ceramics, and produces excellent results with respect to reducing the difference in linear coefficient of expansion between the sub-core portion and the semiconductor integrated circuit element to be connected. On the other hand, the latter is easily calcined at low temperatures, and when a metal wiring portion, a via or the like are formed therein as the need arises, the ceramic material can be calcined simultaneously with a metal material of a high electric conductivity and a comparatively low melting point which is principally made of Cu and Ag.

Preferably, the content of the Si component in the ceramic comprising the sub-core portion is between about 68% by weight and 99% by weight in the $SiO_2$ equivalent. When a cation component other than Si is used as the oxide forming cation that forms oxide having a linear coefficient of expansion that is larger than that of $SiO_2$ within a temperature range of between room temperature and 200° C., the ceramic can be comprised of an oxide glass material having an average linear coefficient of expansion in a range between room temperature and 200° C., that is adjusted to between about 1 ppm/° C. and 7 ppm/° C.

Preferably, the linear coefficient of expansion of $SiO_2$, within the temperature range between room temperature and 200° C., is, before and after, about 1 ppm/° C. which is very small. When the sub-core portion is comprised of the above glass material containing an oxide forming cation for forming an oxide having a linear coefficient of expansion that is larger than 1 ppm/° C., the linear coefficient of expansion of the glass material can be freely adjusted to an arbitrary value not less than 1 ppm/° C., according to the type and content of the oxide forming cation. As a result, the sub-core portion using such a glass material can greatly reduce the difference in linear coefficient of expansion with respect to the semiconductor integrated circuit element to be packaged, and can also greatly improve reliability of the terminal connections with the semiconductor integrated circuit element made by flip-chip connections and the like.

In an embodiment wherein the semiconductor integrated circuit element to be connected comprises an Si semiconductor part, because the linear coefficient of expansion of Si is, before and after, 3 ppm/° C., it is preferable that the linear coefficient of expansion of the oxide glass material be adjusted to be between about 1 ppm/° C. and 6 ppm/° C., and more preferably, between 2 ppm/° C. and 5 ppm/° C. On the other hand, in an embodiment wherein the semiconductor integrated circuit element to be connected is a compound semiconductor part composed of a III-V compound to be matched to GaAs, because the linear coefficient of expansion of the semiconductor is about 5 to 6 ppm/° C., it is preferable that the linear coefficient of the oxide glass material be adjusted to be between 4 ppm/° C. and 7 ppm/° C. In these embodiments, the thermal shear stress resulting from the differences in linear coefficient of expansion between the parts and boards is minimal with respect to the terminal connected structure with the semiconductor integrated circuit element packaged onto the sub-core portion, thereby greatly reducing the incidence of defects such as terminal disconnection.

In the foregoing embodiment, when the content of $SiO_2$ in the oxide glass material comprising the sub-core portion is less than 68% by weight, the linear coefficient of expansion of the glass material is generally at least about 7 ppm/° C., and thus a difference in linear coefficient of expansion between the sub-core portion and the semiconductor part is not substantially reduced and can still be significant. On the other hand, when the content exceeds 99% by weight, the glass melting point rises, and the production costs associated with producing a good-quality glass with minimal residual bubbles increases. Further, it can occasionally be difficult to maintain the linear coefficient of expansion of the glass material at not less than 1 ppm/° C.

Further features and advantages of the present invention will be set forth in, or apparent from, the detailed description of preferred embodiments thereof which follows.

DETAILED DESCRIPTION OF THE PREFERRED EMBODIMENTS

Preferred embodiments of the present invention are described below with reference to the drawings.

Figure 1:
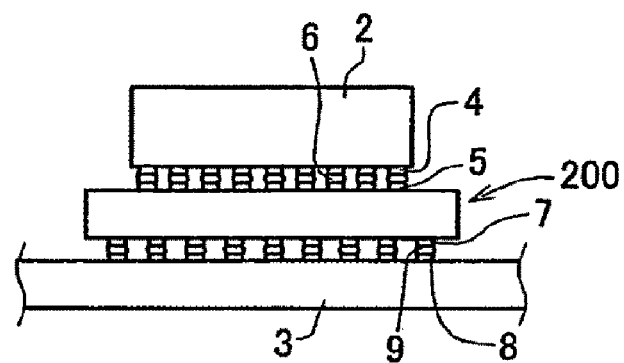
FIG. 1 is a side elevation view illustrating one example of the manner of use of an intermediate board according to the present invention.

FIG. 1 illustrates wiring board construction wherein an intermediate board (wiring board) 200 according to a first embodiment of a wiring board of the present invention is arranged between a semiconductor integrated circuit element 2 and a main board 3. Further, with respect to the terminology used hereinbelow the first main surfaces of the planar or plate-like members of this embodiment are the surfaces that face upwardly in the drawing, and the second main surfaces are the surfaces which face downwardly.

As shown in FIG. 1, the semiconductor integrated circuit element 2 includes a side terminal array 4 which is comprised of a plurality of signal terminals, a power source terminal and a ground terminal on the second main surface. The terminals of the side terminal array 4 is flip-chip connected to the terminals of a first terminal array 5 formed on the first main surface of the intermediate board 200 via a soldering connection portion indicated at 6.

The main board 3 comprises a mother board or an organic laminated package board comprising the intermediate board at a second stage. In both cases, the board is principally made of a macromolecular material reinforced by ceramic particles, or fiber, as a filler. The main board 3 is connected to the terminals of a second terminal array 7 formed on the second main surface of the intermediate board 200 through the terminals of a main board side terminal array 8, comprised of soldering balls or metal pins, via a soldering connection portion indicated at 9.

Figure 4:
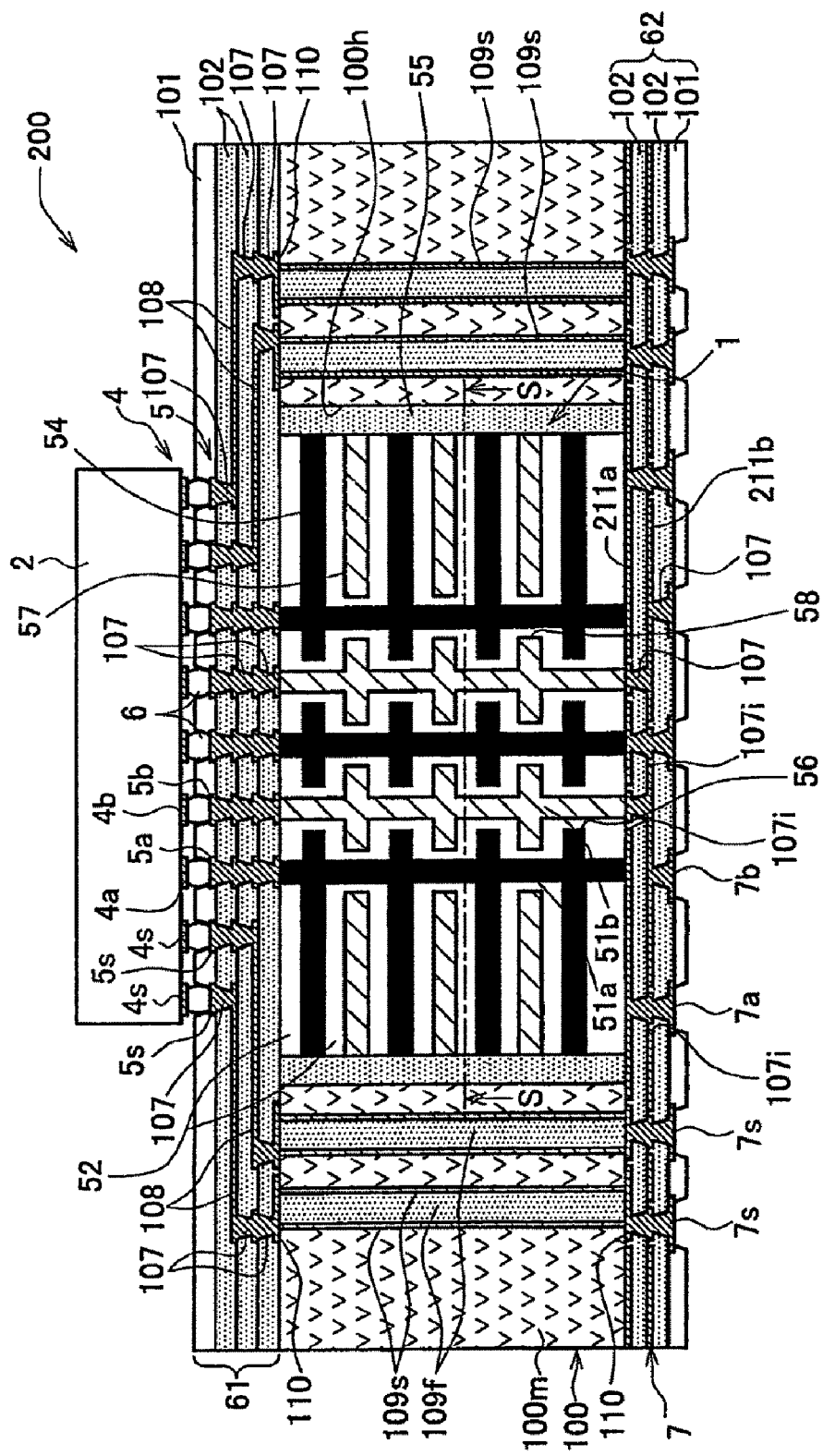
FIG. 4 is a cross sectional view illustrating an intermediate board according to a first embodiment of the present invention.

As shown in FIG. 4, the intermediate board 200 has a board core 100 which is composed of a main core body 100m (also referred to as the wiring board main body) 100m and a sub-core portion 1. The main core body 100m is of a plate-like or planar shape, is chiefly made of a macromolecular material, and is formed with, i.e., includes, formed therein, a sub-core housing portion 100h (also referred to as a capacitor housing portion) which is opened, i.e., has open ends, and is formed in the first main surface by reducing the thickness of the main core body 100m so as to form a recessed area or aperture therein. The sub-core portion 1 is of a plate-like shape, is made of a ceramic, and is housed in the sub-core housing portion 100h so that the thickness thereof, i.e., the vertical dimension as viewed in FIG. 4, matches with that of the main core body 100m. The first terminal array 5 is formed on the first main surface side of the board core 100. The first terminal array 5 is comprised of a first side first type terminal 5a and a first side second type terminal 5b, one of which serves as the power source terminal and the other one of which serves as the ground terminal. The first terminal array 5 also includes a first side signal terminal 5s.

The first terminal array 5 is of an areal extent which is entirely included in an orthogonal geometric projection of the area of sub-core portion 1 onto a reference surface parallel with a planar surface of the board core 100. In other words, and as a result, all the first side first type terminals 5a, the first side second type terminals 5b and the first side signal terminals 5s are joined (by a flip-chip connection) to the semiconductor integrated circuit element 2 (and, in particular, to side terminal array 4) on the sub-core portion 1. Because of this, the difference in linear coefficient of expansion between all of the terminals of the first terminal array 5 and of the semiconductor integrated circuit element 2 is significantly reduced, and thus the potential for a disconnection or the like due to thermal stress is essentially eliminated. In the intermediate board 200 in FIG. 4, the sub-core portion 1 has a larger area than that defined by the first terminal array 5, and the reduction in the effect of thermal stress is enhanced.

The plate-like shaped main core body 100m comprises, for example, a heat-resistant resin plate member (for example, bismaleimide-triazine resin plate), or a fiber-reinforced resin plate member (for example, of glass fiber-reinforced epoxy resin) or the like.

Examples of materials used in the ceramic layer 52 which comprises a main portion of the sub-core portion 1, are alumina (which has a thermal expansion coefficient of 7 to 8 ppm/° C.), a glass ceramic obtained by adding 40 to 60 parts by weight of inorganic ceramic filler such as alumina to borosilicate glass or lead borosilicate glass, and low-temperature calcined ceramic such as $Bi_2O_3$—CaO—ZnO—$Nb_2O_5$ ceramic. Examples of the other ceramic materials include aluminum nitride, silicon nitride, mullite, silicon dioxide and magnesium oxide. The sub-core portion 1 can also be made of a composite material of, for example, a macromolecular material and ceramic (for example, a composite material of a macromolecular material and ceramic where the weight content ratio of the ceramic is higher than the main core body) as long as the material satisfies the condition that the linear coefficient of expansion thereof is smaller than that of the main core body 100m. On the other hand, as a reference technique, the sub-core portion 1 can be replaced by a sub-core portion made of silicon given that the linear coefficient of expansion of silicon is similar to that of a typical semiconductor material.

In preferred embodiments, the ceramic of the sub-core portion can be comprised of a glass material, such as quartz glass having a skeleton component of silicon dioxide (silica, $SiO_2$). In this case, since a suitable physical adjustment is made for applications as a ceramic dielectric, various additional glass components, other than $SiO_2$, can be mixed onto the material. Regarding the abovementioned glass materials, it is preferred that an alkali metal oxide such as $Na_2O$, $K_2O$ or $Li_2O$, and $B_2O_3$ (boracic acid) is mixed as a flux component because the flow properties of the molten glass are enhanced thereby and residual bubbles and the like are suppressed. On the other hand, when an alkali earth metal oxide such as BaO or SrO is added, the permittivity of the glass material can be improved. Excessive additions, however, increase the linear coefficient of expansion of the glass, and thus result in an increase in the difference in the linear coefficient of expansion between the glass material and the other parts, thereby occasionally causing a defective connection due to thermal stress. Further, the flow property of the material is substantially reduced due to a rise in the softening point of the glass, thereby occasionally causing a defect such as the production of residual bubbles.

An increase in the linear coefficient of expansion of the glass is effectively prevented by increasing the content of the $SiO_2$ component or mixing ZnO as the glass addition component. Moreover, oxides such as Ti, Zr or Hf effectively improve the permittivity of the glass as well as make the glass more water-proof. An excessive addition, however, results in a serious deterioration of the flow properties due to a rise in the softening point of the glass, thereby occasionally causing a defect such as residual bubbles.

In a quartz glass material (e.g., an oxide glass material), the content of the Si component is preferably between 68% by weight and 99% by weight of the $SiO_2$ equivalent. A cation component other than Si is comprised of an oxide forming cation that forms an oxide whose linear coefficient of expansion is larger than that of $SiO_2$ (referred to hereinafter as an oxide for adjusting the linear coefficient of expansion) in a temperature range from room temperature up to 200° C., and, preferably, the oxide selected has an average linear coefficient of expansion that is adjusted to be between 1 ppm/° C. to and 7 ppm/° C., for a temperature range from room temperature to 200° C. As a result, the linear coefficient of expansion of the glass material can be readily adjusted to an arbitrary value of not less than 1 ppm/° C. according to the type and content of the oxide component (so that the linear coefficient of expansion is larger than that of $SiO_2$). As a result, the difference in the linear coefficient of expansion between the sub-core portion 1 and the semiconductor part 2 to be packaged can be greatly decreased.

In the case where the semiconductor integrated circuit element 2 is an Si semiconductor part (having an average linear coefficient of expansion, for a temperature range between room temperature and 200° C. of 3 ppm/° C.), the linear coefficient of expansion of the quartz glass material is preferably adjusted to be between 1 ppm/° C. and 6 ppm/° C., and more particularly, between 2 ppm/° C. and 5 ppm/° C.

In another embodiment, the semiconductor integrated circuit element 2 can be comprised of a compound semiconductor part made of a III-V compound which is matched to GaAs (for example, to GaAs of a next-generation high-speed CPU and MMIC (Monolithic Microwave Integrated Circuit)), but in this case, since the linear coefficient of expansion of the semiconductor is about 5 to 6 ppm/° C., the linear coefficient of expansion of the quartz glass material is preferably adjusted to be between 4 ppm/° C. and 7 ppm/° C.

Examples of oxides whose linear coefficient of expansion is larger than $SiO_2$ include alkali metal oxides ($Na_2O$, $K_2O$, $Li_2O$: 20 to 50 ppm/° C.), alkali earth metal oxides (BeO, MgO, CaO, SrO, BaO: 8 to 15 ppm/° C.), ZnO (6 ppm/° C.), and $Al_2O_3$ (7 ppm/° C.). The oxide is preferably selected from these candidate oxides taking into consideration the desired dielectric properties, melting point and glass flow properties. The content of the $SiO_2$ is preferably adjusted to be between 68% by weight and 99% by weight and, more preferably, between 80% by weight and 85% by weight. In order to provide a linear coefficient of expansion within the above range, the residual portion can be comprised of one or more of the above oxides for adjusting the linear coefficient of expansion.

The following are concrete examples of a glass composite which can be adopted for the purposes of the present invention:

$SiO_2$: 80.9% by weight, $B_2O_3$: 12.7% by weight, $Al_2O_3$: 2.3% by weight, $Na_2O$: 4.0% by weight, $K_2O$: 0.04% by weight, and $Fe_2O_3$: 0.03% by weight (softening point: 82° C., linear coefficient of expansion (average value at 20° C. to 200° C.): 3.25 ppm/° C.).

The sub-core portion 1 is implemented as a laminated capacitor (a laminated ceramic capacitor or a capacitor to be built into a wiring board) in this embodiment. The laminated capacitor 1 comprises a first electrode conductor layer 54 which is conductively connected to the first side first type terminal 5a and the second side first type terminal 7a, a ceramic layer 52 which serves as a dielectric layer, and a second electrode conductor layer 57 conductively connected to the first side second type terminal 5b and the second side second type terminal 7b, and the layers are laminated together in this order.

In this embodiment, the ceramic layer 52 is preferably comprised of a high-permittivity ceramic which is principally made of barium titanate ($BaTiO_3$). Suitable examples of materials that can be used in making the ceramic layer are a perovskite compound oxide such as strontium titanate, calcium titanate and lead titanate.

In FIG. 4, the sub-core portion 1 comprises a laminated capacitor wherein the first electrode conductor layer 54 is conductively connected to a first type sub-core conductor 51a, the second electrode conductor layer 57 which is conductively connected to a second type sub-core conductor 51b, and a ceramic layer 52 which is obtained by simultaneously calcining the first electrode conductor layer 54 and the second electrode conductor layer 57, are alternately laminated together.

The sub-core portion 1, which is comprised of such a laminated capacitor, can be manufactured by using, for example, a ceramic green sheet, and the first electrode conductor layer 54 and the second electrode conductor layer 57 can be formed by a printing application of a metal paste. The first electrode conductor layers 54 having the same polarity, and the second electrode conductor layers 57 having the same polarity, are respectively connected together in the direction of lamination, i.e., the vertical direction as viewed in FIG. 4, by a respective first type sub-core conductor 51a, and a respective second type sub-core conductor 51b, with the conductors 51a and 51b comprising respective vias. Further, the electrode conductor layers 54 and 57 having different polarities, and the sub-core conductors 51a and 51b having different polarities, are respectively separated by through holes 56 and 58 formed in the respective electrode conductor layers 54 and 57 at the time of print-patterning of metal paste using a direct-current process.

Figure 2:
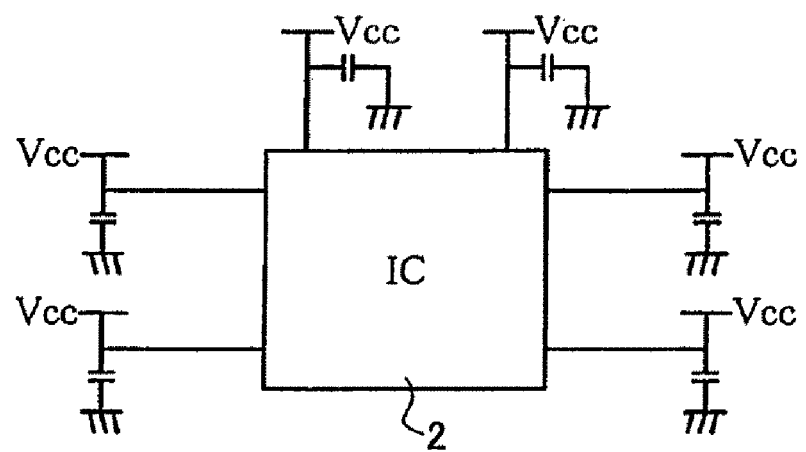
FIG. 2 is an equivalent circuit diagram illustrating one example of the manner of use of a decoupling capacitor in an integrated circuit.

The capacitor so formed serves as a decoupling capacitor which is connected in parallel to the power source line of the semiconductor integrated circuit element 2 as shown in FIG. 2.

The laminated capacitor 1 (i.e., capacitor to be built into the wiring board) is discussed in more detail below in connection with FIGS. 20 to 23.

The laminated capacitor 1 shown in FIGS. 20, 21, 22A and 22B is formed into a rectangular solid shape. It is preferable that the dimensions of the laminated capacitor 1, in the vertical and lateral directions, are between 11.0 mm and 13.0 mm respectively. When the laminated capacitor 1 is of such dimensions, capacitor 1 is of the approximately same size as the semiconductor chip 2, discussed below, and thus the difference in the thermal expansion between the semiconductor chip 2 and the wiring board 200 can be effectively reduced.

The laminated capacitor 1 is comprised of alternately, laminated together, a plurality of the first electrode conductor layers 54, a plurality of the second electrode conductor layers 57 which are opposed to the first electrode conductor layers 54, a plurality of the ceramic layers 52 which serve as the dielectric layers, and the like. The first electrode conductor layers 54 and the second electrode conductor layers 57 are arranged alternately. The ceramic layers 52 are disposed between the first electrode conductor layers 54 and the second electrode conductor layers 57. The first electrode conductor layers 54 and the second electrode conductor layers 57 are electrically insulated from each other by the ceramic layers 52.

The linear coefficient of expansion of the ceramic layer 52 is smaller than the linear coefficient of expansion of the wiring board 200 (which is principally made of macromolecular material), and is larger than the linear coefficient of expansion of the semiconductor board of the semiconductor chip 2, discussed below, to be mounted to the wiring board 200. In the case where the wiring board 200 is an organic board, the linear coefficient of expansion of the wiring board 200 is about 17 to 20 ppm/° C., in a temperature range between room temperature to 300° C. In the case where the semiconductor board of the semiconductor chip 2 is a Si board, the linear coefficient of expansion of the semiconductor board is about 3 ppm/° C., in the temperature range of room temperature to 300° C.

Figure 21:
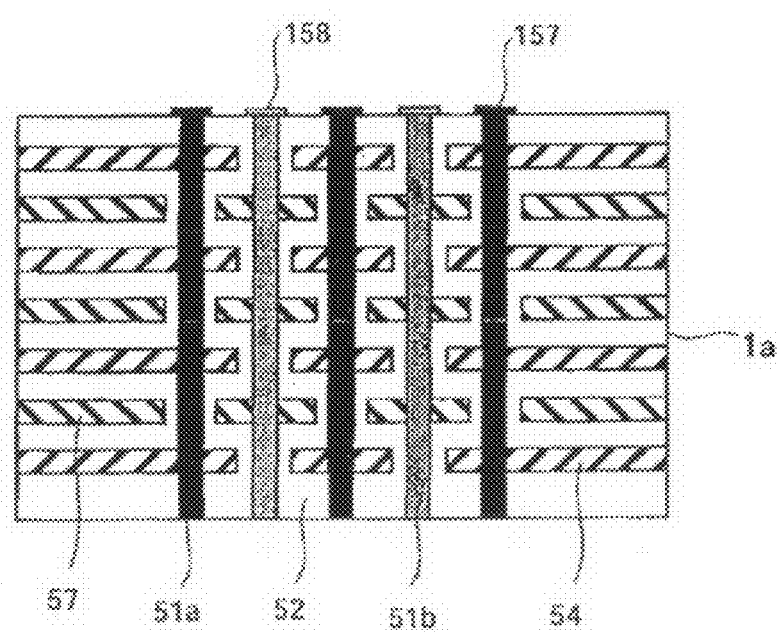
FIG. 21 is a vertical cross sectional view of the capacitor adapted to be built into the wiring board according to the first embodiment.

As shown in FIG. 21, the ceramic layers 52 are formed so as to cover not only the portions between the first electrode conductor layers 54 and the second electrode conductor layers 57 but to also cover, from above, a top layer of the electrode layer (the top layer of the electrode layer is the first electrode conductor layer 54 in FIG. 21) and to cover, from below, a bottom layer of the electrode layer (in FIG. 21, the bottom layer of the electrode layer is the first electrode conductor layer 54).

Figure 22A:
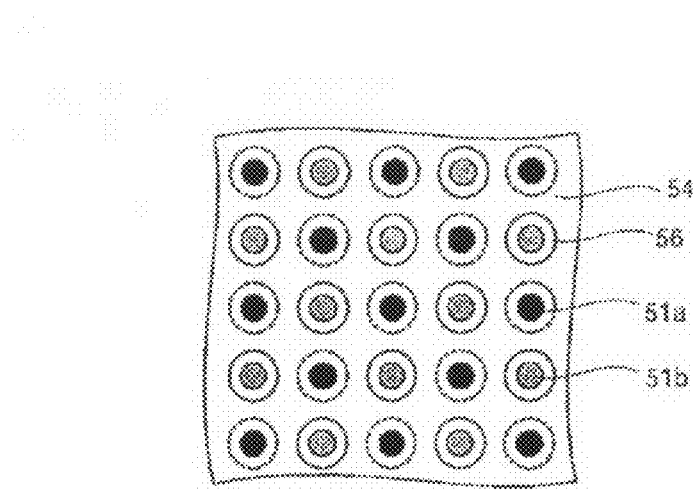
FIGS. 22A and 22B are cross sectional views of the capacitor adapted to be built into the wiring board according to the first embodiment.
Figure 22B:
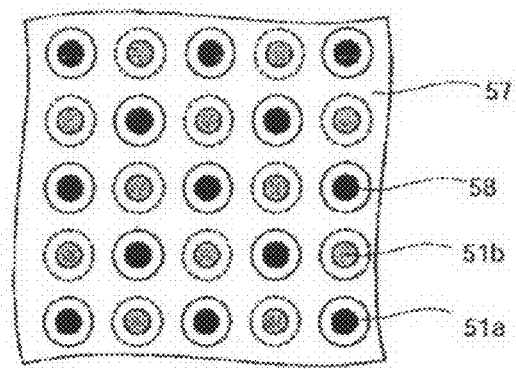

As shown in FIG. 22A, a window portion 56 is formed on an area of the first electrode conductor layer 54 where the second type sub-core conductor 51b (i.e., the second via electrode) comprising the via elements, and the first electrode conductor layer 54 and the second type sub-core conductor 51b comprising the via are electrically insulated from each other. Similarly, as shown in FIG. 22B, a window portion 58 is formed in an area of the second electrode conductor layer 57 where the first type sub-core conductor 51a (i.e., of the first via electrode) comprising the via elements, and the second electrode conductor layer 57 and the first type sub-core conductor 51a comprising the vias, are electrically insulated from each other.

The first type sub-core conductor 51a is electrically connected to a first terminal 157 formed on the surface of the laminated capacitor 1, and the second type sub-core conductor 51b is electrically connected to a second terminal 158 formed on the surface of the laminated capacitor 1. The first terminal 157 and the second terminal 158 are used, respectively, as a power supply terminal and a ground connecting terminal. The first terminal 157 and the second terminal 158 on the surface do not have to be provided.

Figure 20:
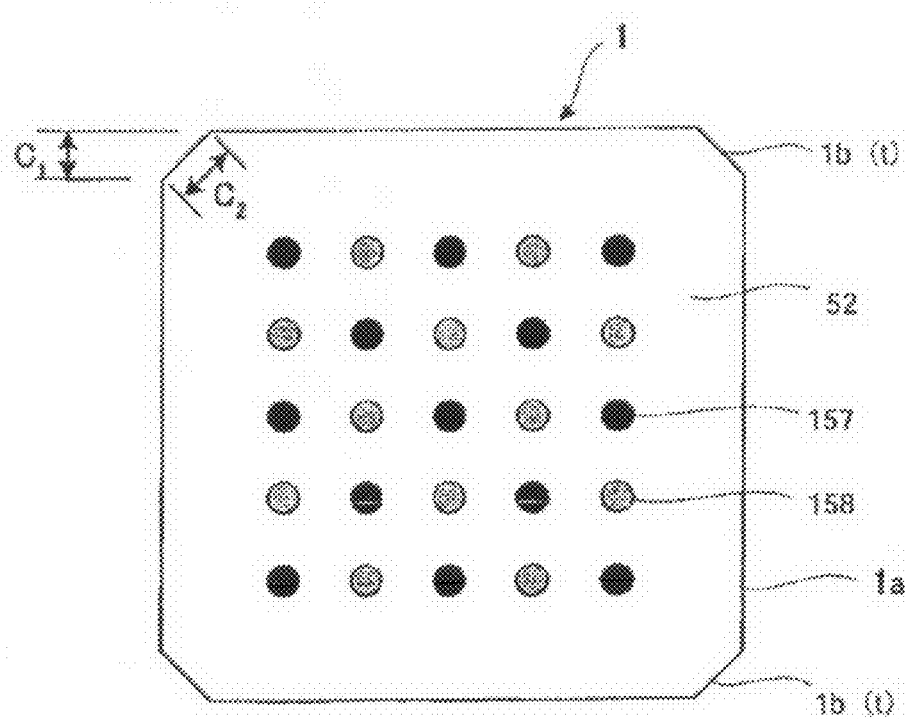
FIG. 20 is a plan view of a capacitor adapted to be built into a wiring board according to the first embodiment.

Referring, e.g., to FIG. 20, an outer peripheral surface 1a is shown which is a side surface other than the surface of the laminated capacitor 1 at which the surface terminal is formed. Planar type chamfered portions, indicated at 1b (t), with a chamfering dimension C1 of not less than 0.6 mm are formed on each of four corners of the outer peripheral surface 1a in this embodiment. The chamfering dimension C1 is of a length shown in FIG. 20. The chamfering dimension C1 may be actually measured, but can be obtained from the C face length, C2, of a line shown in FIG. 20. In this regard, the value obtained by dividing the C face length C2 is the chamfering dimension C1.

Although the chamfered portion 1b (t) may be formed on at least one corner of the outer peripheral surface 1a of the laminated capacitor 1, when it is important to prevent cracking of a resin filler 12, discussed hereinbelow, it is preferable that the chamfered portion 1b (t) is formed on all the corners.

It should be understood that only a single chamfered portion 1b (t) whose chamfering dimension C1 is different from the other three chamfered portions 1b (t) may be formed. Further, instead of changing the chamfering dimension C1 of the single chamfered portion 1b (t), the shape of the single chamfered portion 1b (t) may also be changed.

Figure 23:
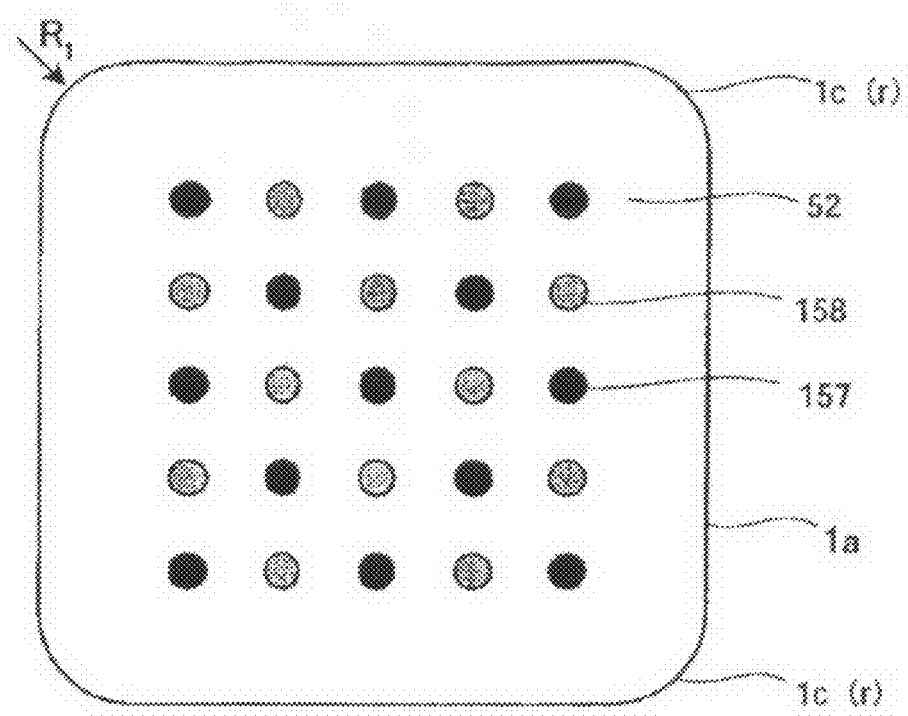
FIG. 23 is a plan view of the capacitor adapted to be built into another wiring board according to the first embodiment.

Preferably, the chamfering dimension C1 is between 0.8 mm and 1.2 mm, from the viewpoint of manufacture of the laminated capacitor. As shown in FIG. 23, instead of, or together with, the chamfered portion 1b (t), a radius portion 1c (r) with a radius of curvature R1 of not less than 0.6 mm may be formed on at least one corner of the outer peripheral surface 1a of the capacitor 1. In this case, it is desirable that the radius of curvature R1 of the radius portion 1c (r) be between 0.8 mm and 1.2 mm from the viewpoint of manufacture of the laminated capacitor. Similarly to the chamfered portion 1b (t), only a single radius portion 1c (r) whose curvature radius R1 is different from the other radius portions 1c (r) may be employed.

The laminated capacitor 1 can, for example, be manufactured in the following manner. Ceramic green sheets having a square shape formed with the pattern of the first electrode conductor layer 54 and ceramic green sheets with a square shape formed with the pattern of the second electrode conductor layer 57 are alternately laminated. A plurality of through holes 56 and 58 extending in the direction of lamination are formed at predetermined positions on the laminated body using a laser or the like. The through holes 56 and 58 are then filled with conductive paste, so that the first type sub-core conductor 51a and the second type sub-core conductor 51b are formed. Thereafter, the resultant laminated body, which is formed with the first type sub-core conductor 51a and the second type sub-core conductor 51b, is calcined. As a result, a laminated capacitor 1 wherein the corners of the outer peripheral surface 1a are of an approximately orthogonal shape (i.e., square corners) is formed. Finally, the corners of the outer peripheral surface 1a of the laminated capacitor 1 are chipped off or cut or otherwise modified so that the chamfered dimension is not less than 0.6 mm, and thus the chamfered portions 1b (t) are formed. As a result, the laminated capacitor 1 is formed which has the chamfered portions 1b (t) with a chamfering dimension C1 of not less than 0.6 mm at the corners of the outer peripheral surface 1a.

As discussed below, a signal line for transmitting a signal to the semiconductor chip 2 is formed in the main core body 100m, but when a substance having a high relative permittivity is located near the signal line, a signal delay occurs. For this reason, when a ceramic with a high permittivity is used for the ceramic layer of the laminated capacitor 1, it is preferable that the distance or spacing between the signal line and the capacitor be relatively large. In this embodiment, since the chamfered portions 1b (t) and the radius or rounded portions 1c (r) are formed at the corners of the outer peripheral surface 1a of the laminated capacitor 1, the distance from the signal line, which is located near the corners of the laminated capacitor 1, to the ceramic layer 52 is larger in comparison with a construction wherein that does not include the chamfered portions 1b (t) and the radius portions 1c (r). As a result, with the disclosed arrangements, any signal delay of a signal on a signal line located near the corners of the laminated capacitor 1 is reduced.

It is noted that a direction and position recognition mark for indicating the direction and position of the laminated capacitor 1 with respect to the core board at the time of packaging of the laminated capacitor 1 is sometimes formed on the front or rear surface of the laminated capacitor 1. However, because a large number of terminals are present on the front and rear surfaces of the laminated capacitor 1, when such a direction and position recognition mark is formed on these surfaces, the terminals can be confused with the direction and position recognition mark, and thus confusion or a misconception as to the direction and position recognition mark can potentially occur. To overcome this problem, in an embodiment wherein a single chamfered portion 1b (t) is provided which has a chamfering dimension C1 is different from the other chamfered portions 1b (t), the chamfered portion 1b (t) with the different chamfering dimension C1 can itself be used as the direction and position recognition mark. As a result, even if the direction and position recognition mark is not formed on the front or rear surface of the laminated capacitor 1, the direction and the position of the laminated capacitor 1 with respect to the main core body 100m can be indicated. As a result, the problem with respect to potential misconception as to the direction and position recognition mark is solved.

In the embodiment just described, the linear coefficient of expansion of the ceramic layer 52 is smaller than the linear coefficient of expansion of the wiring board 200 which, as indicated above, is principally made of macromolecular material (and, more specifically, the coefficient of thermal expansion of the main core body 100*m*) and is larger than the linear coefficient of expansion of the semiconductor board of the semiconductor chip 2 to be mounted to the wiring board 200. For this reason, the difference in thermal expansion between the wiring board 200 and the semiconductor chip 2 can be reduced, and cracking of the semiconductor chip 2 due to thermal expansion of the wiring board 200 and the semiconductor chip 2 can be suppressed.

Turning again to FIG. 4, as indicated above, a second terminal array 7 is formed on the second main surface of the board core 100. The second terminal array 7 is comprised of the second side first type terminals 7*a* and the second side second type terminals 7*b* which are conductively connected to the first side first type terminal 5*a* and the first side second type terminal 5*b*, respectively, and the second side signal terminal 7*s* which is conductively connected to the first side signal terminal 5*s*.

The area defined by the first terminal array 5 is such that the entire array is included within an orthogonal geometric projection of the area of the sub-core portion 1 onto a reference surface parallel with the planar surface of the board core 100 (for example, parallel to the first main surface of board core 100).

A filling coupled portion 55 made of a macromolecular material is formed in and fills in a space in the sub-core portion housing portion 100*h* so as to provide a gap between the sub-core portion 1 and the core man body 100*m*. The filling coupled portion 55 affixes the sub-core portion 1 to the main core body 100*m*, and absorbs any difference in the linear coefficient of expansion in the in-plane direction (i.e., the horizontal direction as viewed in FIG. 4) and the thickness (vertical) direction between the sub-core portion 1 and the main core body 100*m*, by means of the elastic deformation of portion 55.

Figure 3:
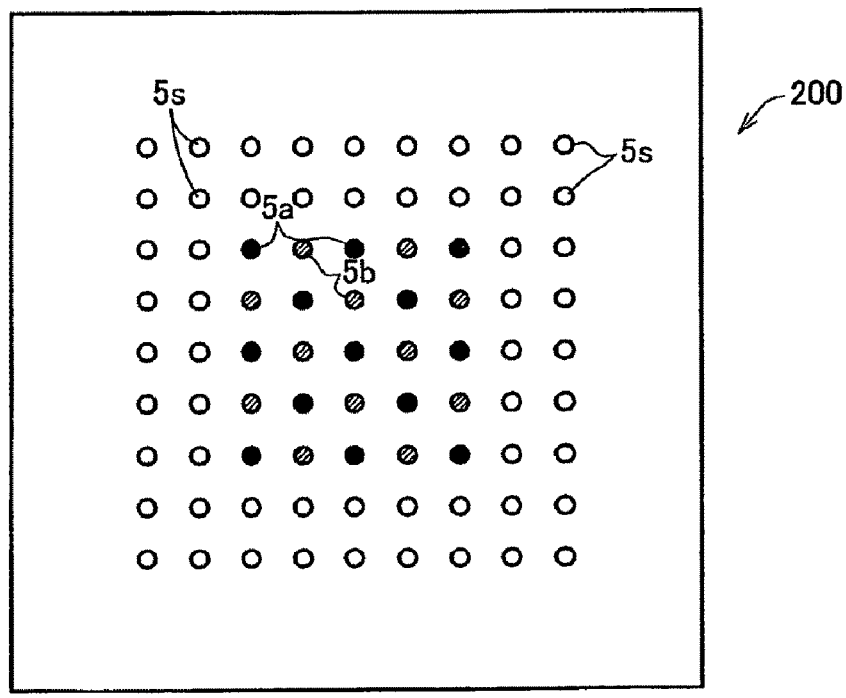
FIG. 3 is a plan view of a first embodiment of a first terminal array of the intermediate board of FIG. 1.

As shown in FIG. 3, in the first terminal array 5, the first side first type terminals 5*a* and the first side second type terminals 5*b* are arranged alternately in an alternating reticular (or houndstooth) pattern wherein the terminals alternate in both the rows and columns. Similarly, in the second terminal array 7, the second side first type terminals 7*a* and the second side second type terminals 7*b* are arranged alternately in an alternating reticular (or houndstooth) pattern corresponding to the terminal arrangement of the first terminal array 5. Both the arrays 5 and 7 have a plurality of first side signal terminals 5*s* and second side signal terminals 7*s* which surround the reticular arrangement of the power source terminals and the ground terminals.

In the board core 100 of FIG. 4, the first main surface of the sub-core portion 1, as well as the first main surface of the main core body 100*m*, is covered with a first wiring laminated portion 61 wherein a dielectric layer 102 made of macromolecular material and conductor layers including a wiring or a surface conductor for a ground or power source are alternately laminated, thereby providing a so-called build-up wiring layer. The first terminal array 5 is exposed and formed from the first main surface of the first wiring laminated portion 61. With this arrangement, because the sub-core portion 1, as well as the main core body 100*m*, are collectively covered with the first wiring laminated portion 61, the first wiring laminated portion 61 and the first terminal array 5 can be formed using approximately the same steps as those of a typical build-up organic package board, thereby contributing to a simplification of the manufacturing steps required.

The second main surface of the board core 100 is covered with a second wiring laminated portion 62 where the dielectric layer 102 made of macromolecular material and the conductor layer including wiring or the surface conductor for a ground or power source are alternately laminated. The second terminal array 7 is exposed and formed from the first main surface of the second wiring laminated portion 62.

In both of the wiring laminated portions 61 and 62, the dielectric layer 102 preferably has a thickness of, for example, between 20 μm and 50 μm, as a build-up resin insulating layer comprised of resin composite such as epoxy resin. In a preferred embodiment, the dielectric layer 102 is made of an epoxy resin, and is produced by mixing dielectric filler made of $SiO_2$ with the epoxy resin being present in an amount of between 10% by weight and 30% by weight. The relative permittivity $\in$ of the material is adjusted to be 2 to 4 (for example, about 3). The conductor layer has a thickness of between 10 μm and 20 μm, wherein both the wiring and the surface conductor are pattern plated layers on the dielectric layer 102 (comprising, for example, an electrolytic Cu plated layer). The conductor layer has an area where the conductor is not arranged by patterning. The upper and lower dielectric layers occasionally contact with each other directly in areas wherein the conductor is not formed.

In FIG. 4, the first type sub-core conductor 51*a* and the second type sub-core conductor 51*b* are formed in a thicknesswise direction of the sub-core portion 1, i.e., extend transversely of, i.e., orthogonally to, layers 54 and 57. The first type sub-core conductor 51*a* and the second type sub-core conductor 51*b* correspond to the first side first type terminal 5*a* and the first side second type terminal 5*b* of the first terminal array 5, and are conductively connected to the second side first type terminal 7*a* and the second side second type terminal 7*b* of the second terminal array 7. The first type sub-core conductor 51*a* and the second type sub-core conductor 51*b* are conductively connected to the first side first type terminal 5*a* and the first side second type terminal 5*b*, respectively, by means of a via conductor 107 which is formed so as to penetrate the dielectric layers 102 of the first wiring laminated portion 61. When the conductors 51*a* and 51*b* for the ground and the power source are formed in parallel in the sub-core portion 1, low inductance paths for the ground and the power source, and thus a low impedance, results.

Both the first type sub-core conductor 51*a* and the second type sub-core conductor 51*b* are coupled with a second side first type surface conductor 211*a* and a second side second type surface conductor 211*b* in the second wiring laminated portion 62 by means of the via conductor 107. The second side first type terminal 7*a* and the second side second type terminal 7*b* of the second terminal array 7 are connected to the second side first type surface conductor 211*a* and the second side second type surface conductor 211*b*, respectively.

The via conductors 107 of the wiring laminated portions 61 and 62 preferably have a structure wherein via holes are drilled through the dielectric layer 102 by a well-known method, such as the photo via process (where the dielectric layer 102 is comprised of a photosensitive resin composition such as UV cure epoxy resin) or a laser boring via process (where the dielectric layer 102 is composed of a non-photosensitive resin composition), and the insides of the via holes are filled or covered with a via conductor by plating or the like. Both of the wiring laminated portions 61 and 62 are preferably covered with a solder resist layer 101 comprised of a photosensitive resin composition so that the terminal arrays 5 and 7 are exposed.

As shown in FIG. 3, in the first terminal array 5 (and the same applies to the second terminal array 7), the first side first type terminal 5*a* and the first side second type terminal 5*b* are arranged in an array in a central inner or inside area, and the first side signal terminal 5s is arranged in an array outside of the inner area.

As shown in FIG. 4, a wiring connection 108 is provided in the first wiring laminated portion 61, for a first side signal, that extends the signal transmission path to an area outside of the area defined by the sub-core portion 1 and is conductively connected to the first side signal terminal 5s. One end of the wiring connection 108 for the first side signal is conductively connected to a through hole signal conductor 109s formed in the thicknesswise (transverse or vertical) direction of the main core body 100m so as to bypass the sub-core portion 1.

In the element side terminal array 4 of the semiconductor integrated circuit element 2, the signal terminals 4s are arranged with a narrow gap therebetween, similarly to the terminals 4a and 4b for the power source and ground. With respect to the signal terminals 4s positioned on the outer peripheral portion of the array, with the arrangement shown, an increase is provided in the spacing or distance thereof in the in-plane direction from the corresponding second side signal terminal 7s in the second terminal array formed on the rear surface of the intermediate board 200. In most cases, the terminal array 4 protrudes to the outside of, i.e., beyond, the sub-core portion 1. In the above construction, however, the element side signal terminal 4s and the first side signal terminal 5s to be soldered and connected can be positioned right on the sub-core portion 1. This results in a significant reduction in the difference in linear coefficient expansion, and the conductive connection can also be readily provided for the second side signal terminal 7s which is sufficiently far away or removed.

The through hole conductor 109s formed on the main core body 100m preferably has a larger axial section diameter than that of the via conductor 107 formed on the wiring laminated portions 61 and 62. Such a through hole conductor 109s can be formed by drilling a through hole using a drill, or the like, through the main core body 100m in the plate thickness direction, for example, and covering the inside of the through hole with a metal layer of plated Cu or the like. The inside of the through hole conductor 109s is preferably filled with a resin hole filling material 109f such as an epoxy resin. Further, both end surfaces of the through hole conductor 109s are sealed by conductor pads 110.

In an application wherein it is desired that the via conductor 107 and the conductor pad 110 be separated from the surface conductors for the power source layer and the ground layer with respect to DC, a hole portion 107i is formed on the surface conductor, and the via conductor 107, or the conductor pad 110, may be arranged in the hole portion 107i so that a circular gap is provided.

In the intermediate board 200 of FIG. 4, the sub-core housing portion 100h is constructed so as to penetrate the main core body 100m, and the second wiring laminated portion 62 is in contact with the second main surface of the sub-core portion 1 housed in the sub-core housing portion 100h. In this construction, because the main core body 100m, which is chiefly made of a macromolecular material having a large linear coefficient of expansion is removed from the position of the sub-core portion 1, a substantial reduction in the difference in linear coefficient of expansion between the semiconductor integrated circuit element 2 and the intermediate board 200 can be achieved.

Figure 13:
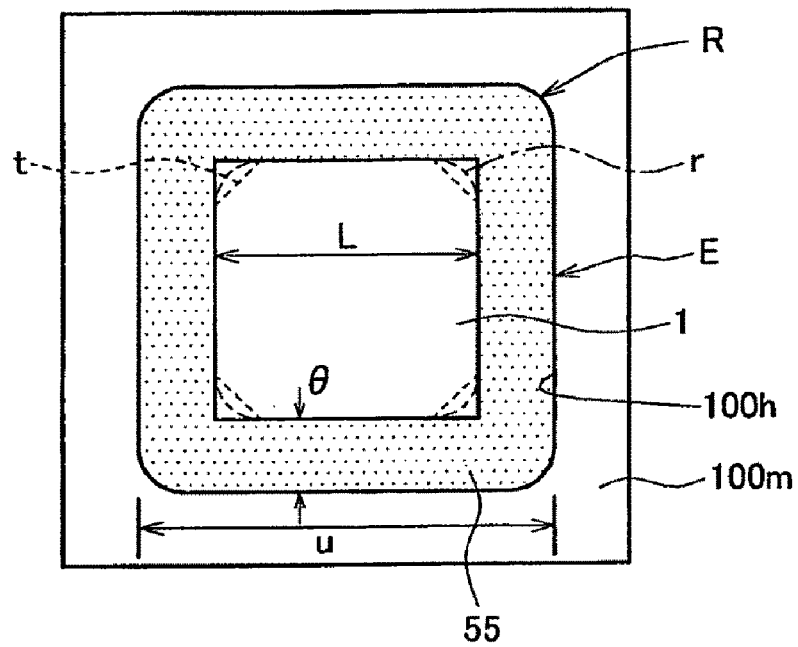
FIG. 13 is a plan view illustrating the shape of a sub-core housing portion and the sub-core portion in accordance with a one embodiment of the invention.

FIG. 13 illustrates a typical cross section of the sub-core housing portion 100h and the sub-core portion 1 taken along a plane (S-S) which is parallel to the plate or planar surface of the sub-core portion 1 in the intermediate board 200 of FIG. 4. A gap between an inner peripheral surface of the sub-core housing portion 100h and the outer peripheral surface of the sub-core portion 1 is filled with the filling coupled portion 55.

The sub-core housing portion 100h preferably has an inner peripheral edge which is quadrate in cross section, and a radius portion R is formed on its corners with a dimension of between 0.1 mm and 2 mm. A curved surface according to the radius surface of the sub-core housing portion 100h is also correspondingly formed on projecting corners formed on the filling coupled portion 55 with the above-mentioned corners. For this reason, air bubbles are not likely to form in the macromolecular material near the projecting corners, and stress is avoided even with a history of temperature change, i.e., change over time for a range of temperatures. As a result, cracking or the like rarely occurs.

Figure 14:
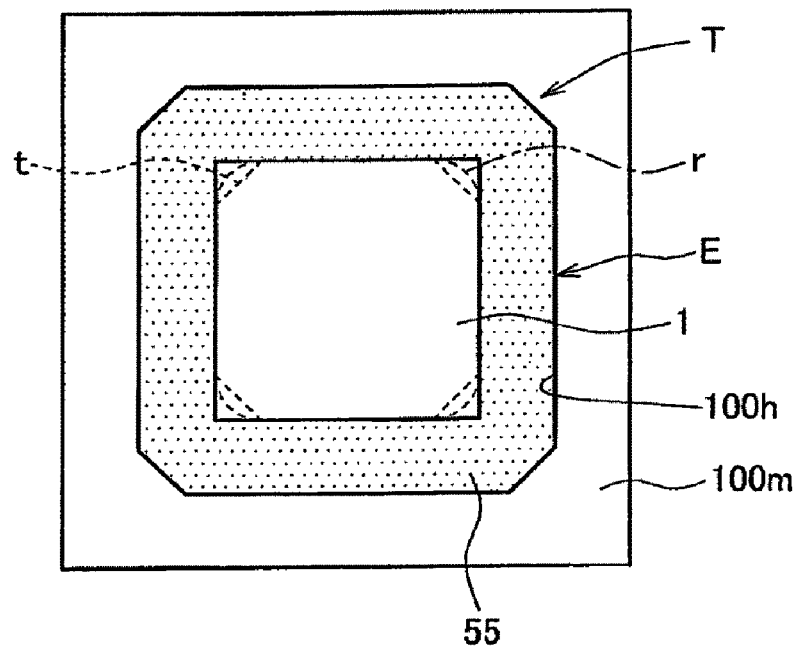
FIG. 14 is a plan view illustrating the shape of the sub-core housing portion and the sub-core portion in accordance with a further embodiment of the invention.

In another embodiment, instead of the radius portions R, as shown in FIG. 14, a chamfered portion T, of a similar dimension range, is formed. In FIGS. 13 and 14, with respect to the inner edge of the sub-core housing portion 100h, the sides other than the radius portion R or the chamfered portion T at the corners are straight or linear. When the radius portions R or the chamfered portions T is between 0.1 mm and 2 mm, residual bubbles and cracking are largely prevented. This effect is significant in an embodiment wherein, with the dimension of one side of the sub-core portion denoted L and the thickness of the filling coupled portion 55 denoted E (in a portion thereof where the radius portions or the chamfered portions are not formed, and measured as the distance between the inner peripheral surface of the sub-core housing portion 100h and the outer peripheral surface of the sub-core portion 1 opposed to the inner surface), θ/L is preferably between about 0.040 and 0.090 (so that, for example, if E=0.8 mm, and L=12 mm, θ/L=0.067). Further, and similarly, the absolute value of the thickness E is preferably between about 0.50 mm and 2.00 mm, more preferably between about 0.75 mm and 1.50 mm, and most preferably between about 0.75 mm and 1.25 mm.

Figure 15:
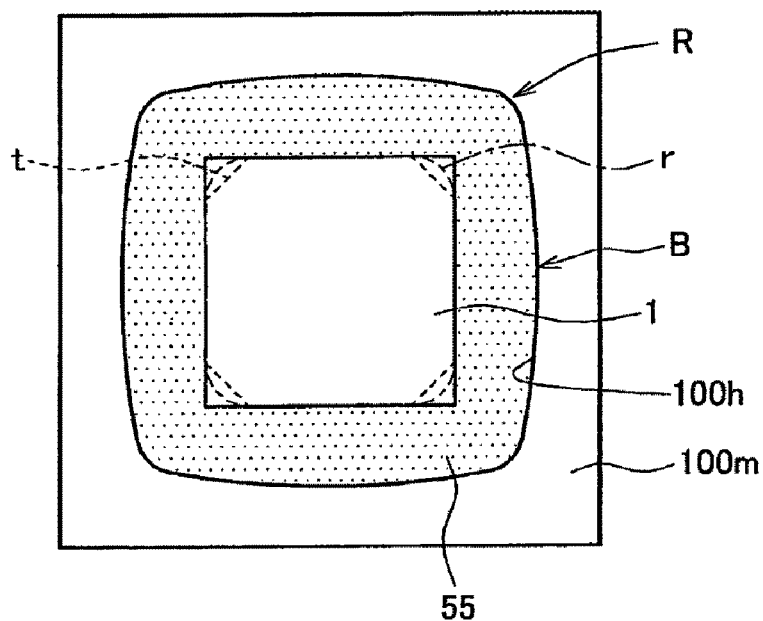
FIG. 15 is a plan view illustrating the shape of the sub-core housing portion and the sub-core portion in accordance with another embodiment of the invention.
Figure 16:
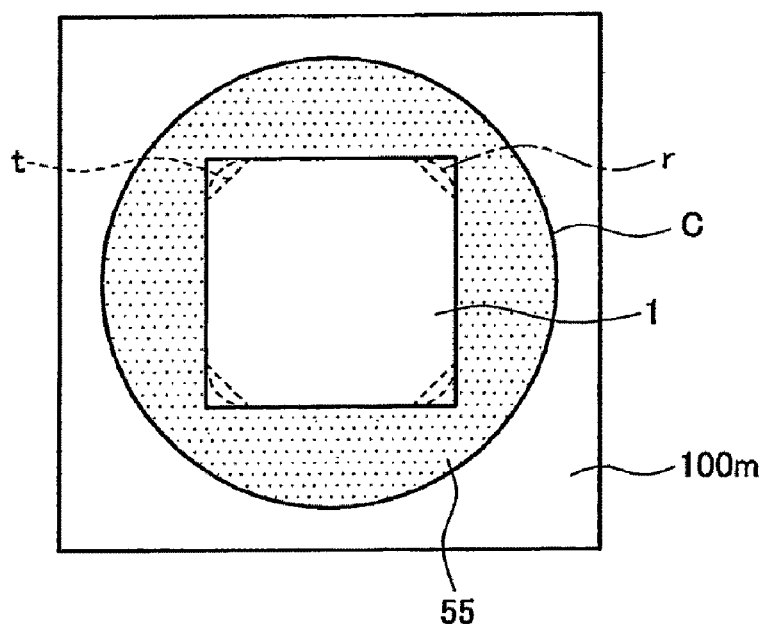
FIG. 16 is a plan view illustrating the shape of the sub-core housing portion and the sub-core portion in accordance with a further embodiment of the invention.

In an important implementation, the inner edge of the sub-core housing portion 100h is formed as shown in FIG. 15. More specifically, in this implementation a radius portion R with an overall dimension of between 0.1 mm and 2 mm is formed at the corners, but, in addition, the remaining or residual sides comprise curved portions B of a convex outward curvature and which have a radius of curvature larger than the radius portions R. Thus, in the sub-core housing portion 100h, the inner peripheral edge, as viewed in cross section in a plane parallel to the planar or plate surface of the sub-core portion 1, is comprised of only the curved portion which has a radius of curvature not less than 0.1 mm and a convex outward curvature. With this construction, residual bubbles and cracking are similarly suppressed. When, as shown in FIG. 16, the cross section of the inner peripheral edge C of the sub-core housing portion 100h is circular, the effect is further enhanced.

The results of an experiment conducted in order to verify the above effects are discussed below. In this experiment, an experimental product corresponding to the intermediate board 200 of the characteristic embodiment of FIG. 4 was manufactured so as to have the following constitution. The main core body 100m was a substrate wherein copper foil was applied to both surfaces of glass fiber-reinforced epoxy resin, and having a thickness of 0.87 mm. The dimension L of one side of the sub-core housing portion 100h was varied within a range of 13.5 mm to 15 mm. The radius formed on the corners was 0.5 mm and 1.5 mm so as to provide two benchmarks or standards. The sub-core portion 1 was a calcined product of a laminated body where barium titanate with dimensions of 12 mm×12 mm and a thickness of 0.87 mm, Nickel electrodes were laminated. Chamfered portions "t" with dimensions varying alternately between 0.311 mm and 1.174 mm were formed at the corners by chipping off the material using a cutting machine.

The above mentioned sub-core portion 1 was arranged in the sub-core housing portion 100h, and the gap therebetween was filled with epoxy resin so as to form the filling coupled portion 55 discussed above, the epoxy resin was cured, and a test product was produced. The thickness E of the filling coupled portion 55 was set at various values in the range between 0.75 mm and 1.50 mm by adjusting the gap width. These test products were subjected to a thermal impact test, defined by U.S. MIL Standard 883D, with 90 cycles under a defined condition C, and a check was made as to whether a cracking occurred at the corners of the sub-core housing portion 100h and the corners of the sub-core portion 1.

The chamfering dimension of the sub-core portion 1 was classified into three clauses or standards: less than 0.1 mm, between 0.1 mm to and 0.6 mm, and 0.6 mm or more, and a numerical ratio of the test products wherein a crack occurred was obtained. (The total number of the test products was 7 to 10 in the respective classes or standards.)

In the results of this testing, there were no test products wherein a crack occurred at the corner of the sub-core housing portion 100h. On the other hand, with respect to the corners of the sub-core portion 1, for the case wherein no crack was found in any of the test products was graded as excellent (⊙), for the case wherein there was one test product wherein a crack occurred was found was graded as satisfactory (○), for the case wherein although a crack did not occur at the corners of the sub-core housing portion 100h, a crack occurred in all the corners of the sub-core portion 1 was graded as passable (Δ). These results are shown in Tables 1 to 3.

TABLE 1

| μ | Θ | Inner surface R of sub-core housing portion | Chamfering of sub-core side C (mm) | Judgment | The number of "passed" judgments as to cracking of sub-core side |
|---|---|---|---|---|---|
| 13.5 mm | 0.75 mm | 0.5 mm | not less than 0.6 | ⊙ | 8/8 |
|  |  |  | not less than 0.1 to less than 0.6 | ○ | 3/8 |
|  |  |  | less than 0.1 | Δ | 0/8 |
|  |  | 1.5 mm | not less than 0.6 | ⊙ | 8/8 |
|  |  |  | not less than 0.1 to less than 0.6 | ○ | 5/8 |
|  |  |  | less than 0.1 | Δ | 0/8 |

TABLE 2

| μ | Θ | Inner surface R of sub-core housing portion | Chamfering of sub-core side C (mm) | Judgment | The number of "passed" judgments as to cracking of sub-core side |
|---|---|---|---|---|---|
| 14.0 mm | 1.00 mm | 0.5 mm | not less than 0.6 | ⊙ | 7/7 |
|  |  |  | not less than 0.1 to less than 0.6 | ○ | 6/9 |
|  |  |  | — | — | — |
|  |  | 1.5 mm | not less than 0.6 | ⊙ | 9/9 |
|  |  |  | not less than 0.1 to less than 0.6 | ○ | 5/7 |
|  |  |  | — | — | — |

TABLE 3

| μ | Θ | Inner surface R of sub-core housing portion | Chamfering of sub-core side C (mm) | Judgment | The number of "passed" judgments as to cracking of sub-core side |
|---|---|---|---|---|---|
| 15.0 mm | 1.50 mm | 0.5 mm | not less than 0.6 | ⊙ | 9/9 |
|  |  |  | not less than 0.1 to less than 0.6 | ○ | 6/7 |
|  |  |  | — | — | — |
|  |  | 1.5 mm | not less than 0.6 | ⊙ | 10/10 |
|  |  |  | not less than 0.1 to less than 0.6 | ○ | 5/6 |
|  |  |  | — | — | — |

According to the above results, when the amount of chamfering provided on the corners of the sub-core portion 1 is not less than 0.1 mm, and more particularly, not less than 0.6 mm, cracking originating from the corners of the sub-core portion 1 can be effectively suppressed.

In all the embodiments of FIGS. 13 to 16, the cross sectional shape, in a plane parallel with the plane or plate surface of the sub-core portion 1, is quadrate, i.e., square or substantially square, and the corners have a pin corner or squared off shape, but as shown by the alternate long and short dash lines in the drawings, a radius portion r, with dimension of between 0.1 mm and 2 mm can be formed on the corners of the sub-core portion 1. As a result, the concentration of stress at the corners (the projecting corners) of the filling coupled portion 55 can more easily be reduced. Further, cracking in the filling coupled portion 55 originating from the corners of the sub-core portion 1 can also be more easily suppressed. As shown by broken lines in the drawings, instead of the radius portions r, a chamfered portion t of a similar dimensional range can be provided, and a similar effect can be achieved. Suppression of cracking originating from the corners of the sub-core portion 1 is greatest in the case where the ratio $\theta/L$ is adjusted to be between 0.040 and 0.090. Similarly, the absolute value of the thickness $\theta$ is preferably between 0.75 mm and 1.50 mm, and more preferably between 0.75 mm and 1.25 mm.

Figure 17:
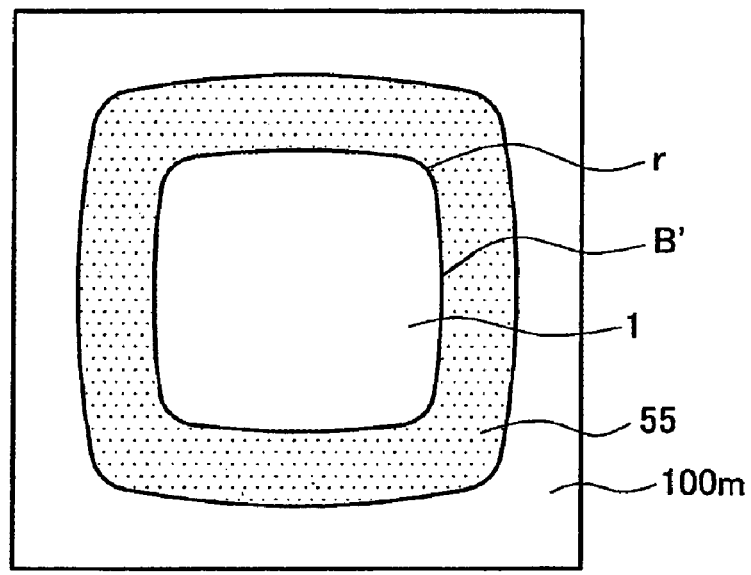
FIG. 17 is a plan view illustrating the shape of the sub-core housing portion and the sub-core portion in accordance with yet another embodiment of the invention.
Figure 18:
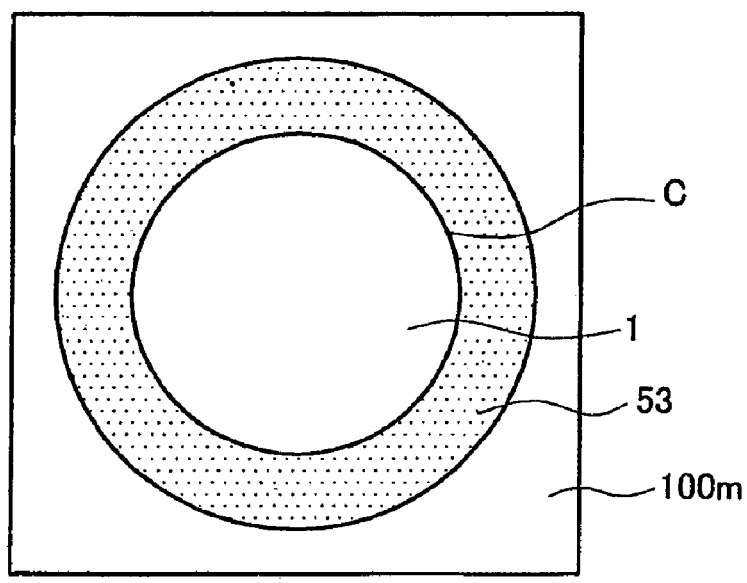
FIG. 18 is a plan view illustrating the shape of the sub-core housing portion and the sub-core portion in accordance with a still further embodiment of the invention.

In another important embodiment, the outer edge of the sub-core portion 1 is formed into the shape shown in FIG. 17. More specifically, the radius portion r, with a dimension of between 0.1 mm and 2 mm, is formed at the corners, and, in addition, the other sides comprise curved portions B' which have a larger radius of curvature than the radius portion and are of convex outward curvature. Preferably, in the sub-core portion 1, the outer peripheral edge of a cross section in a plane parallel to the planar or plate surface of the sub-core portion 1 is comprised only of a curved portion with a radius curvature of not less than 0.1 mm and of convex outward curvature. This construction also similarly provides suppression of residual bubbles and cracking. As shown in FIG. 18, when the inner peripheral edge C in the cross section of the sub-core portion 1 is circular, the effect is further enhanced.

Various modifications and variations in the intermediate board according to the present invention are discussed below. In the embodiments discussed below, portions similar to those of the intermediate board 200 of FIG. 4 are given by similar reference numbers, and any detailed explanation thereof is omitted.

Figure 5:
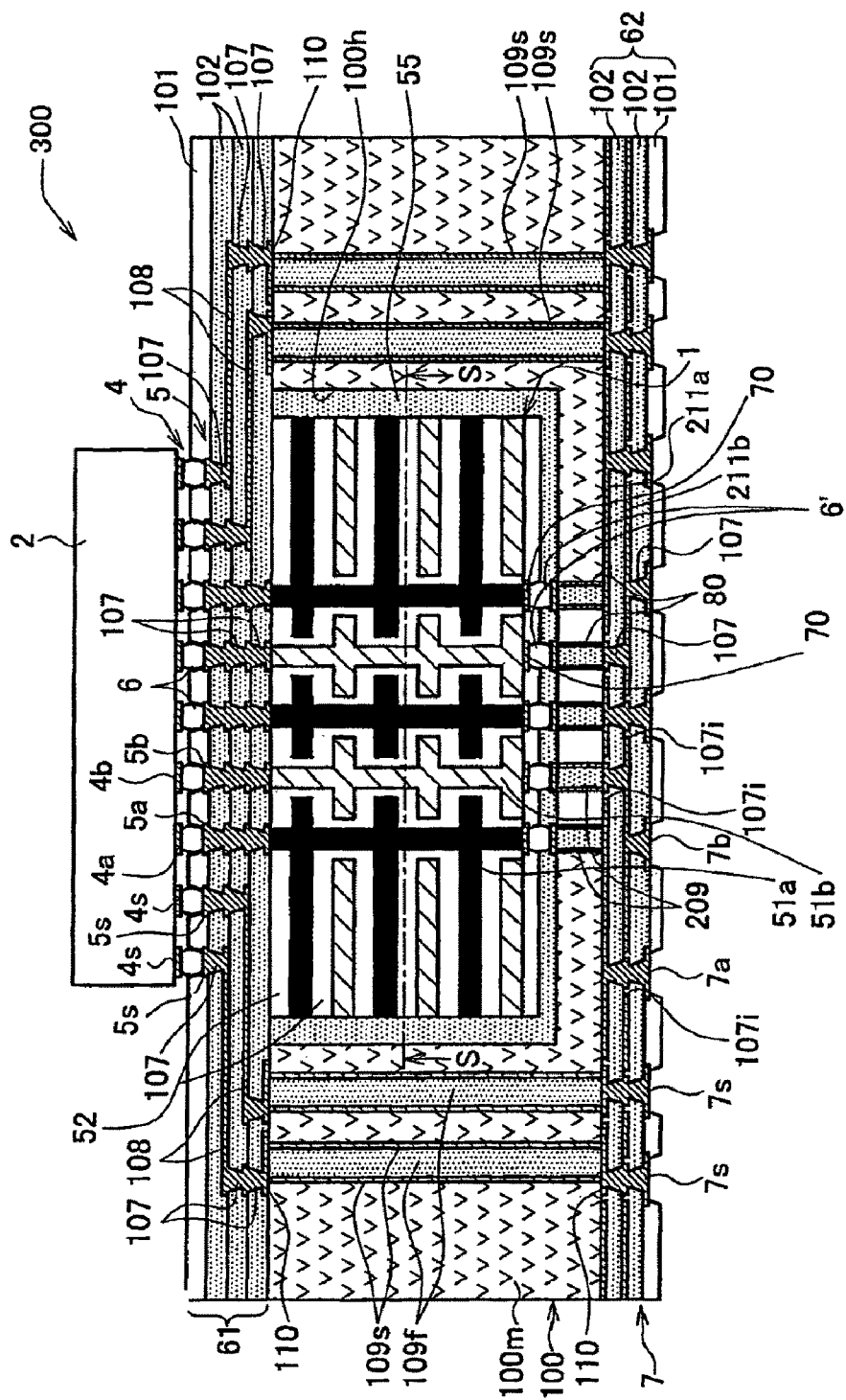
FIG. 5 is a cross sectional view illustrating an intermediate board according to a second embodiment of the present invention.

Turning to FIG. 5, in the intermediate board 300 shown in FIG. 5, the sub-core housing portion 100h comprises a concave portion, with a bottom, which opens at the first main surface of the main core body 100m. The second wiring laminated portion 62 is formed so as to contact the second main surface of the main core body 100m on a rear surface of the concave portion. This construction has the advantage that because the sub-core portion 1 is not exposed from the second main surface of the main core body 100m, the flat second wiring laminated portion 62 can be formed more simply. More specifically, a bottom through hole conductor portion 209, which is conductively connected to respective terminals comprising the second terminal array 7, penetrates a portion of the main core body 100m comprising the bottom of the sub-core housing portion 100h. The sub-core conductors 51a and 51b formed on the sub-core portion 1 are conductively connected to the bottom through hole conductor portion 209. More specifically, a pad 80 of the bottom through hole conductor portion 209 is flip-chip connected to a pad 70 of the sub-core conductor via a soldering connection portion 6'.

With respect to the cross sectional shapes of the sub-core portion 1 and the sub-core housing portion 100h, shapes similar to those discussed above with reference to FIGS. 13 to 16 can be adopted.

Figure 6:
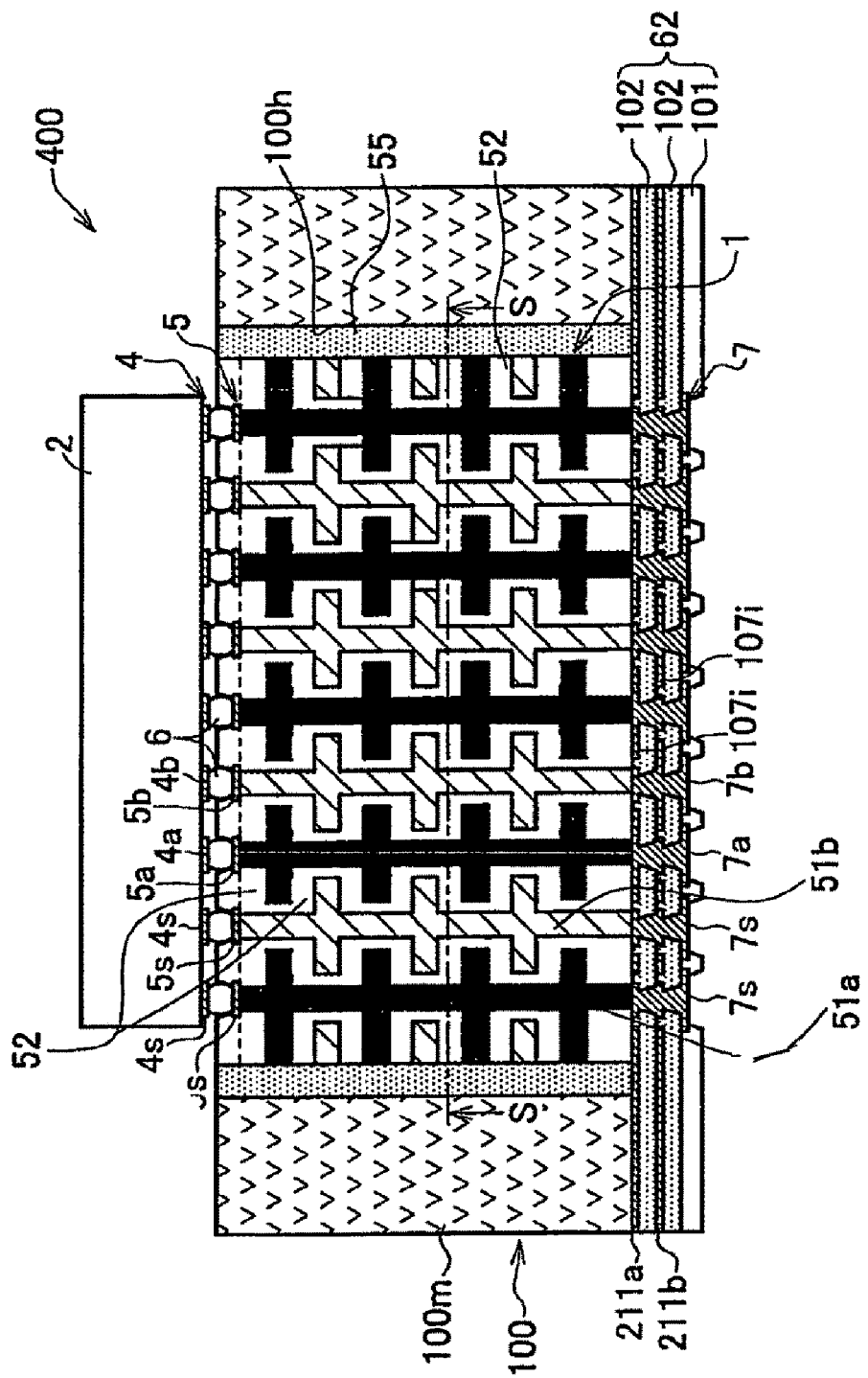
FIG. 6 is a cross sectional view illustrating an intermediate board according to a third embodiment of the present invention.

Referring to FIG. 6, the intermediate board 400 in FIG. 6 is of a construction wherein the first side first type terminal 5a and the first side second type terminal 5b comprising the first terminal array 5 are exposed and formed on the first main surface of the sub-core portion 1. The first type sub-core conductor 51a and the second type sub-core conductor 51b correspond to the first side first type terminal 5a and the first side second type terminal 5b of the first terminal array 5, and are conductively connected to the second side first type terminal 7a and the second side second type terminal 7b of the second terminal array 7. The first type sub-core conductor 51a and the second type sub-core conductor 51b are formed on the sub-core portion 1 in the thicknesswise direction, i.e., extend orthogonally to the plane of the board 400 (i.e., vertically as shown in FIG. 6). With this construction, the first wiring laminated portion 61, which is principally made of macromolecular material, is eliminated from the first main surface of the sub-core portion 1, and the semiconductor integrated circuit element 2 and the sub-core portion 1 are directly connected together by the soldering connection portion 6. As a result, a further reduction is provided in the difference in linear coefficient of expansion between the semiconductor integrated circuit element 2 and the intermediate board 400. Since the wiring which is conductively connects the terminals does not extend laterally, just on the sub-core portion 1, the inductance of the transmission path conductively connected to the terminals can be reduced, thereby reducing the impedance. With respect to the cross sectional shapes of the sub-core portion 1 and the sub-core housing portion 100h, similar shapes to those discussed above with reference to FIGS. 13 to 16 can be adopted.

Figure 7:
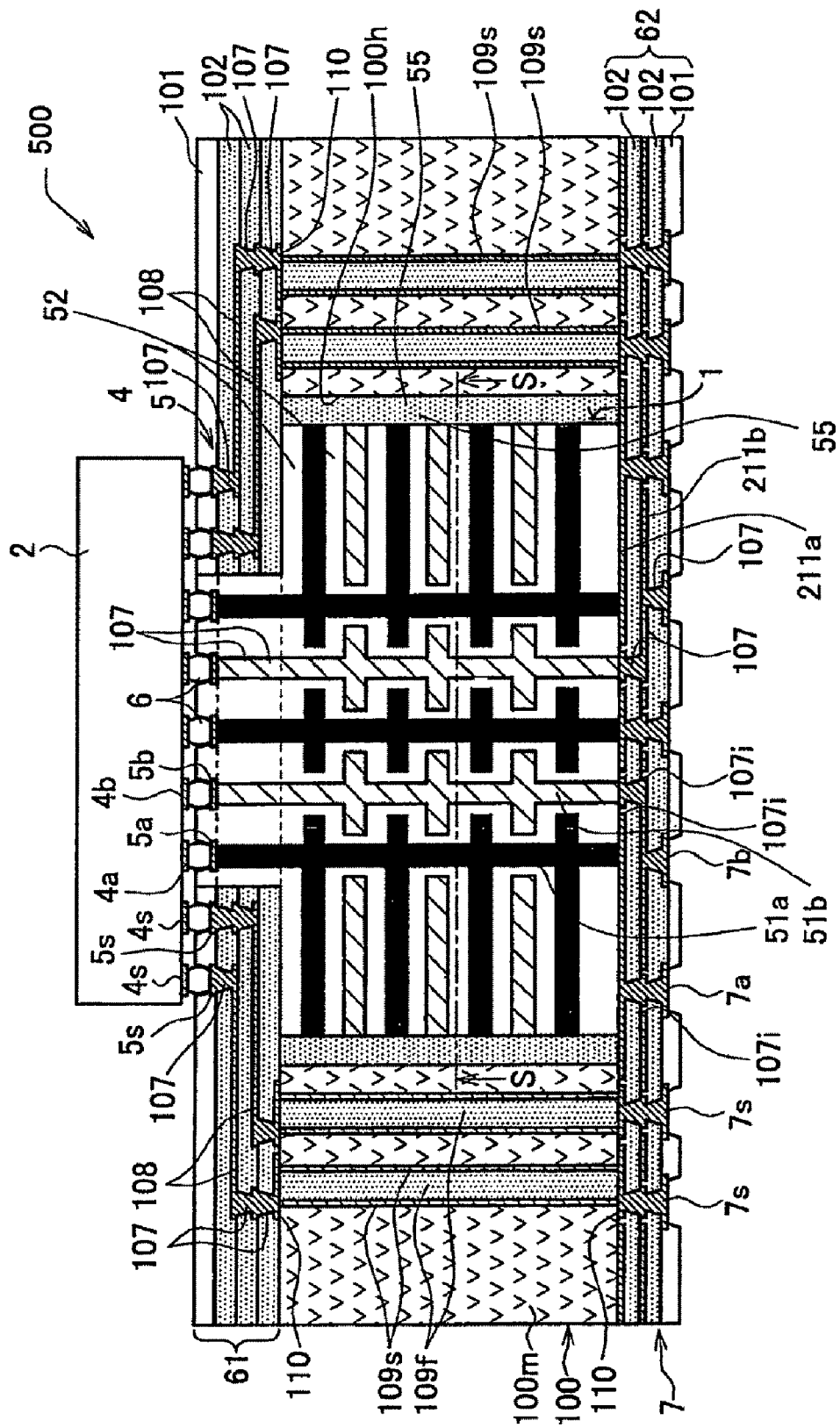
FIG. 7 is a cross sectional view illustrating an intermediate board according to a fourth embodiment of the present invention.

Turning to a further embodiment, in an intermediate board (wiring board) 500 shown in FIG. 7, the outer peripheral edge of the first main surface of the sub-core portion 1, as well as the first main surface of the main core body 100m, are covered with the first wiring laminated portion 61 wherein the dielectric layer 102 made of macromolecular material and the conductor layer including the wiring or the surface conductor for the ground or power source are alternately laminated. The first side signal terminal 5a is formed so as to be exposed at the surface of the first wiring laminated portion 61. The first side signal wiring 108 by means of which the signal transmission path is extended outwardly beyond the area of the sub-core portion 1, is provided in the first wiring laminated portion 61 so as to be conductively connected to the first side signal terminal 5s. One end of the first side signal wiring 108 is conductively connected to a signal through hole conductor 109s formed in the main core body 100m in the thicknesswise direction so as to bypass the sub-core portion 1. Because this construction enables the wiring conductively connected to the signal terminals on the array outer periphery to be extended laterally outwardly in the in-plane direction, this construction is advantageous when the spacing or distance between the terminals of the first terminal array 5 is small. Again, with regard to the cross sectional shapes of the sub-core portion 1 and the sub-core housing portion 100h, similar shapes to those discussed above with reference to FIGS. 13 to 16 can be adopted.

Figure 8:
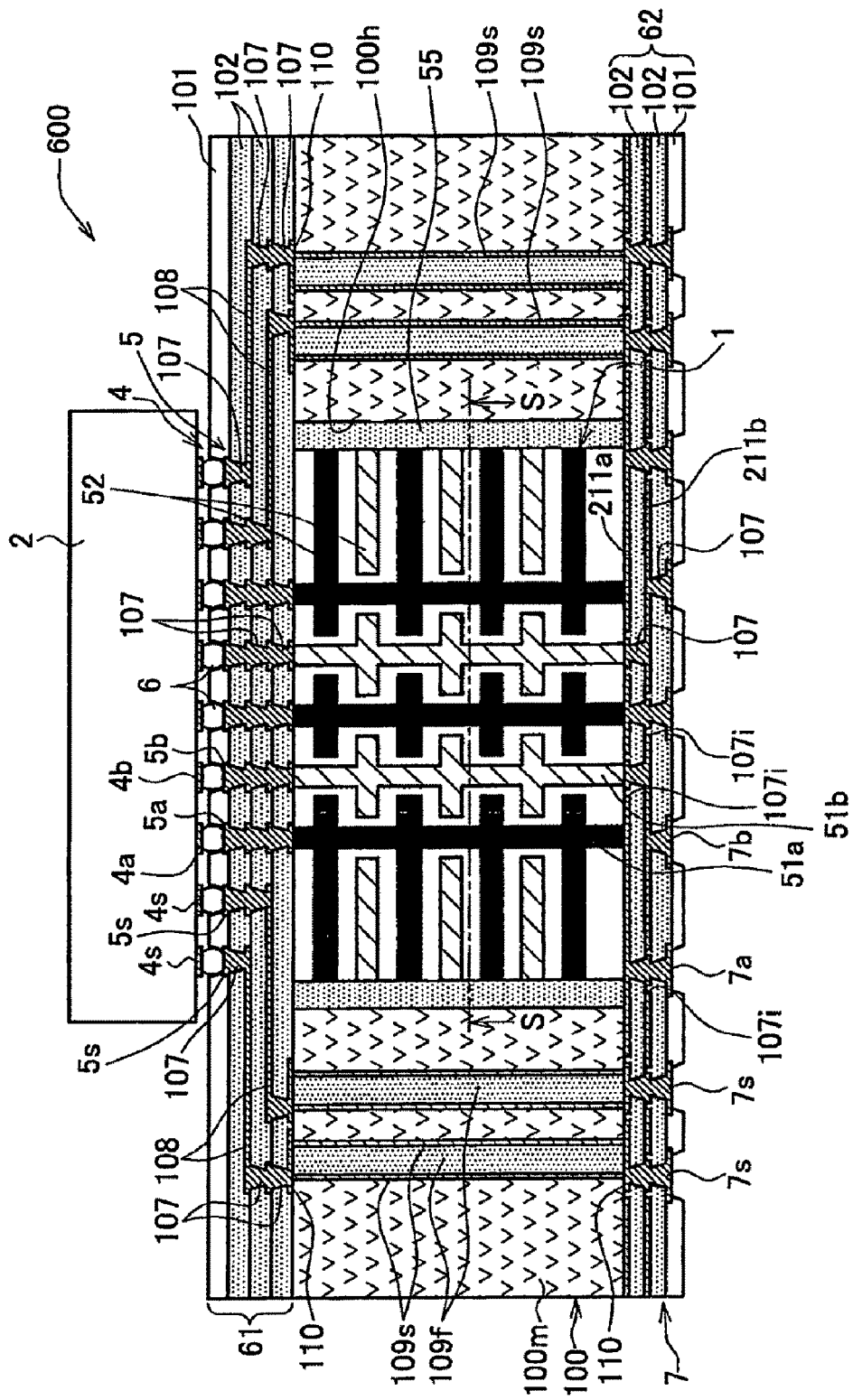
FIG. 8 is a cross sectional view illustrating an intermediate board according to a fifth embodiment of the present invention.
Figure 9:
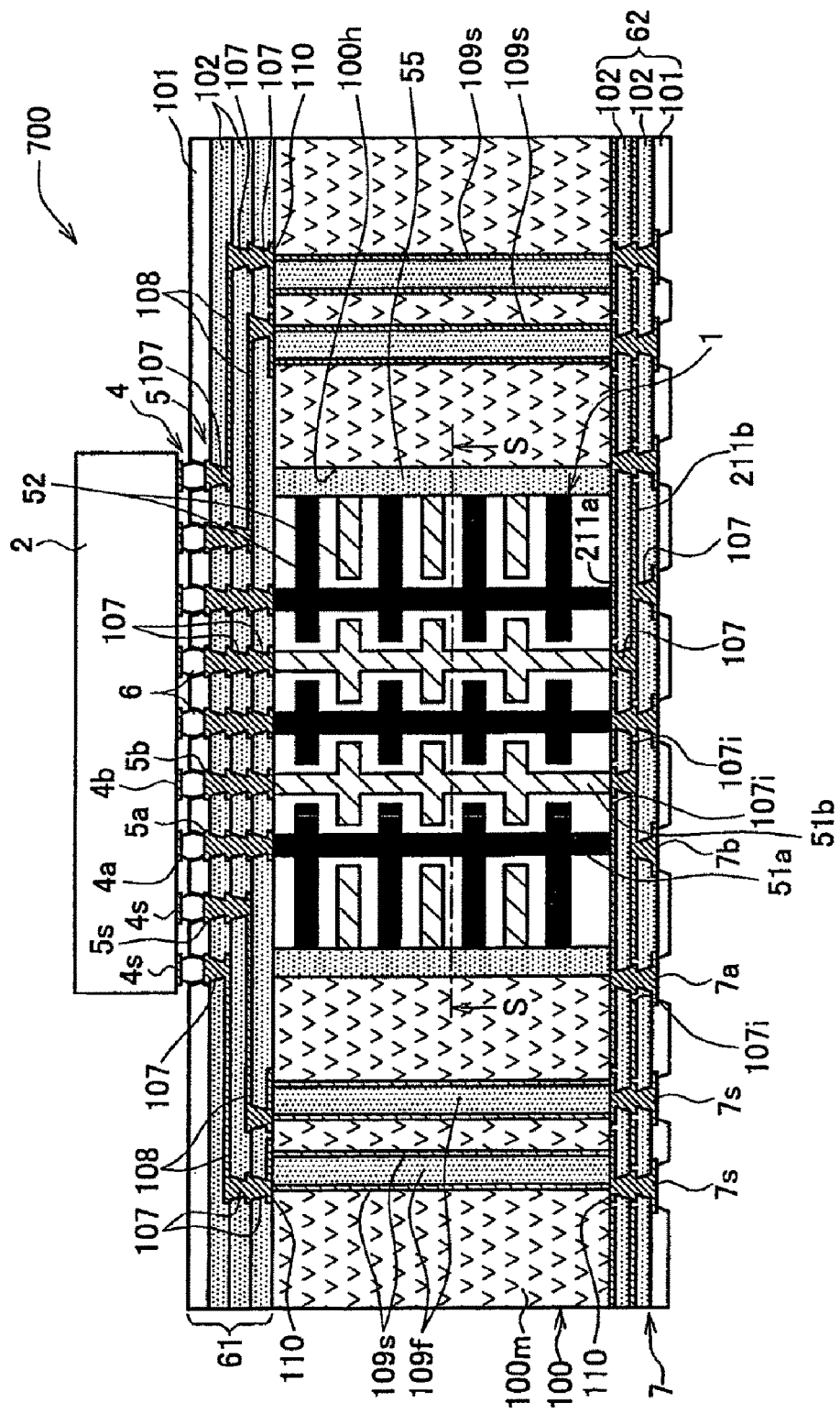
FIG. 9 is cross sectional view illustrating an intermediate board according to a sixth embodiment of the present invention.

In the above embodiment, the sub-core portion 1 is formed so that the area thereof is larger than that of the semiconductor integrated circuit element 2. However, the sub-core portion 1 can be formed so as to have approximately the same area as the projected area of the semiconductor integrated circuit element 2. Similarly, for the intermediate board 600 of FIG. 8, the area of entire first terminal array 5 can be confined, as shown, so as to fit within the area of the sub-core portion 1, and simultaneously the sub-core portion 1 is constructed so as to fit into a smaller area than the semiconductor integrated circuit element 2. In the case where the influence upon the electrical connection between the terminals positioned on the outer periphery with respect to the semiconductor integrated circuit element 2 and the soldering connection portion 6 is of little concern, such as is the case with the intermediate board 700 of FIG. 9, it is possible to provide that the area of the sub-core portion 1 is smaller than that of the area of the first terminal array 5. Again, with respect to the cross sectional shapes of the sub-core portion 1 and the sub-core housing portion 100h, similar shapes to those discussed above with reference to FIGS. 13 to 16 can be adopted.

Figure 10:
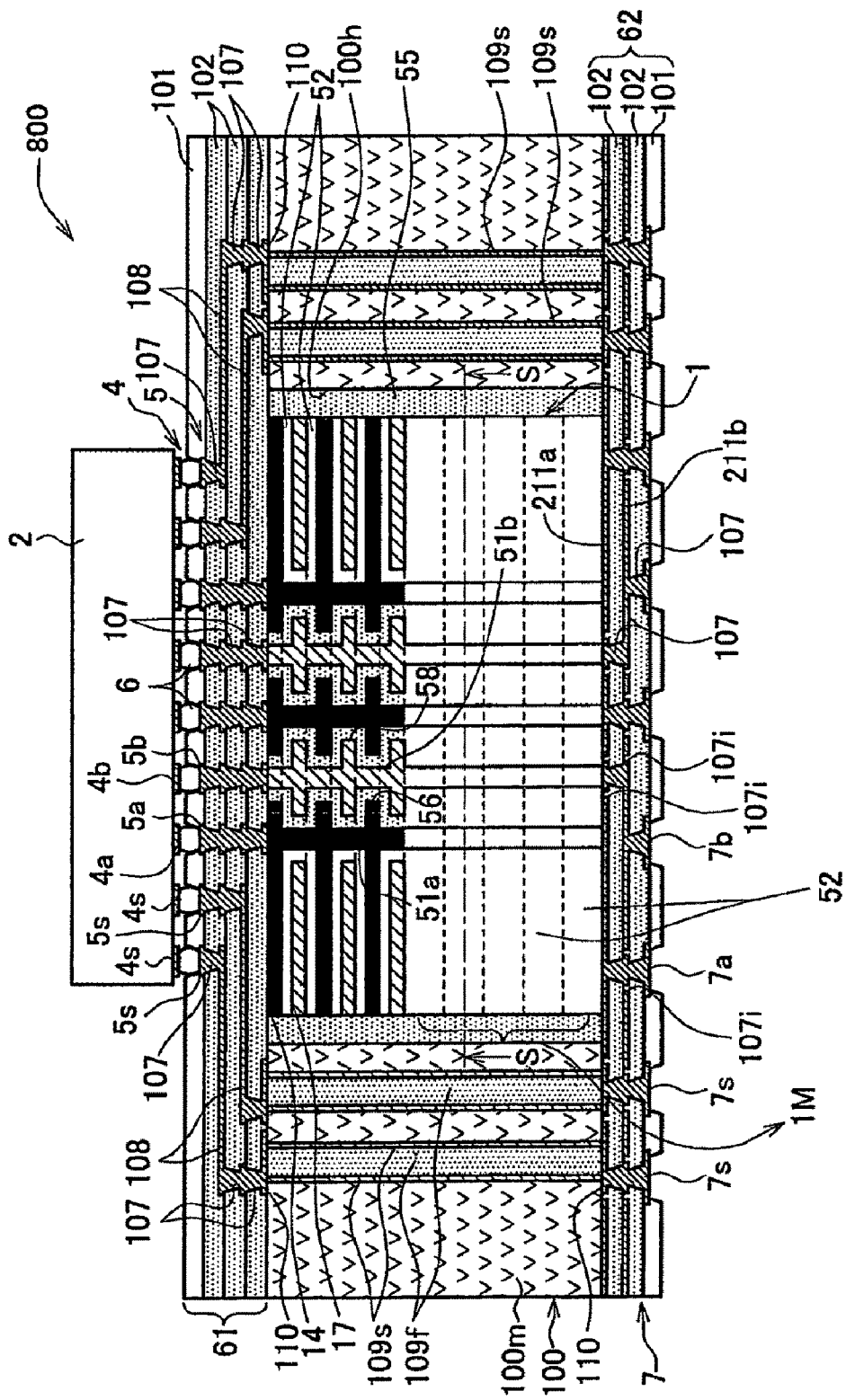
FIG. 10 is a cross sectional view illustrating an intermediate board according to a seventh embodiment of the present invention.

Turning to FIG. 10, the intermediate board 800 in FIG. 10 is an example of an embodiment wherein only the ceramic layer 52 included in the sub-core portion 1 is used to form a capacitor, and the residual ceramic layer 52 is part of a sub-main core body 1M which does not include a capacitor. As above, the cross sectional shapes of the sub-core portion 1 and the sub-core housing portion 100h can be similar to those discussed with reference to FIGS. 13 to 16.

Figure 11:
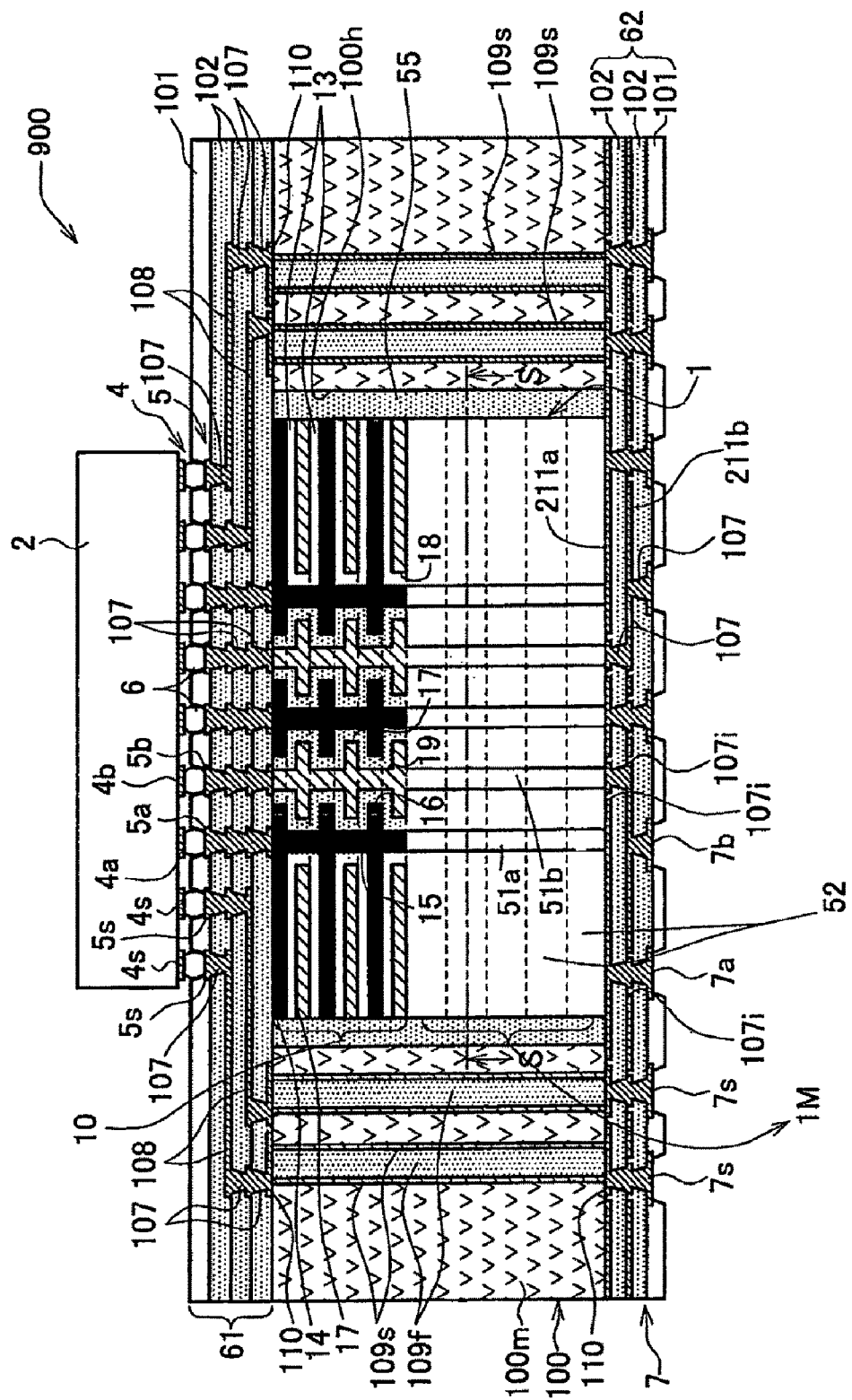
FIG. 11 is a cross sectional view illustrating an intermediate board according to an eight embodiment of the present invention.

Referring to FIG. 11, the intermediate board 900 in FIG. 11 is an example of an embodiment wherein the intermediate board 800 of FIG. 10 is fully developed, and the laminated capacitor comprises a thin-film capacitor portion 10 formed on the main surface of the sub-core portion 1. The thin-film capacitor portion 10 is constructed so that a plurality of dielectric thin films 13 (i.e., dielectric layers) and a plurality of electrode conductor thin films 14 and 17 (i.e., the first electrode conductor layer 14 and the second electrode conductor layer 17) comprising the capacitor are alternately laminated. The thin-film capacitor portion 10 is constructed so that the first electrode conductor layers 14 conductively connected to the first side first type terminal 5a and the second electrode conductor layers 17 conductively connected to the first side second type terminal 5b are arranged alternately in the thickness direction (or direction of lamination) so as to be separated by the dielectric thin film 13. Since the total area is enlarged by the multilayered arrangement of the electrode conductor thin films 14 and 17 and, in addition, the dielectric layers are thinner, the realizable electrostatic capacitance can be greatly increased even if the dimensions of the capacitor portion 10 are small. As above, the cross sectional shapes of the sub-core portion 1 and the sub-core housing portion 100h can be similar to those discussed above with reference to FIGS. 13 to 16.

Figure 12:
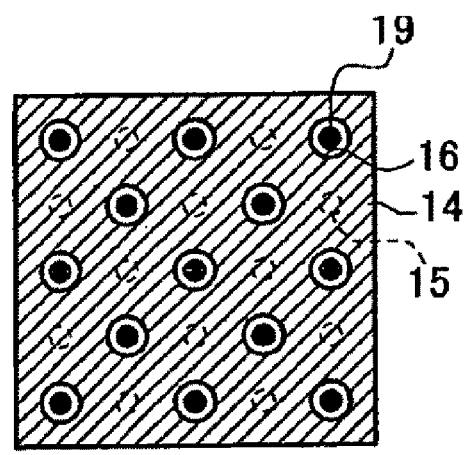
FIG. 12 is a cross sectional view illustrating a planar form of an electrode conductor layer of a capacitor incorporated into an intermediate board in accordance with a further embodiment of the invention.
Figure 12:
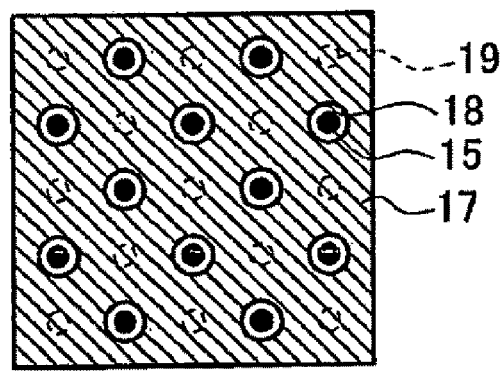

It is noted that it appears in FIG. 11 that the electrode conductor thin films 14 and 17 are divided in an in-plane direction by the through holes 16 and 18, but it will be understood that films 14 and 17 are actually each a continuous thin film which is formed in the in-plane direction on the corresponding portions, apart from the through holes 16 and 18, as shown in FIG. 12.

This applies also to the dielectric thin film 13 (and this construction is also used for the laminated capacitor 1 in FIGS. 4 to 11).

Preferably, the thickness of the dielectric thin film 13 is, for example, between 10 nm and 1000 nm, and more preferably, between 30 nm and 500 nm. On the other hand, the thickness of each of the electrode conductor thin films 14 and 17 is, for example, preferably between 10 nm and 500 nm, and more preferably, between 50 nm and 500 nm.

The electrode conductor thin films 14 and 17 and the coupled conductor portions 15 and 19 (conductively connected to the first type sub-core conductor 51a and the second type sub-core conductor 51b of the sub-core portion 1, respectively) can be comprised of metal such as Cu, Ag, Au or Pt, and are preferably formed by a vapor deposition method such as sputtering and vacuum deposition, with vacuum deposition being used in the embodiment described. The dielectric thin film 13 is preferably comprised of an inorganic dielectric such as an oxide or nitride, and is formed by a vapor deposition method such as high-frequency sputtering, reactive sputtering or chemical vapor deposition (CVD). In the embodiment under consideration, the dielectric thin film 13 is formed by a sol-gel method as an oxide thin film comprised of a compound oxide having a perovskite crystal structure selected from one, or not less than two, kinds of barium titanium, strontium titanate and lead titanate.

Figure 19:
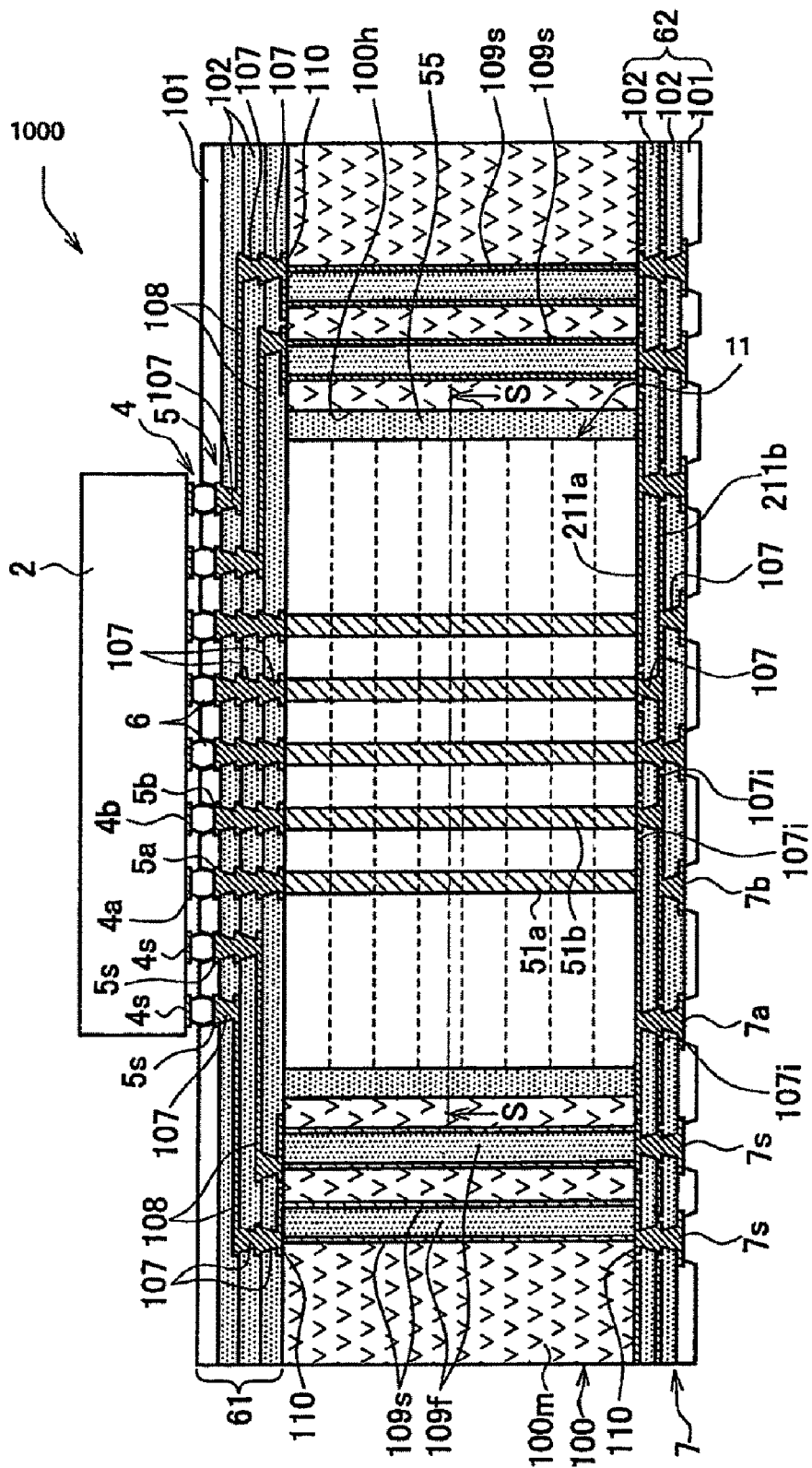
FIG. 19 is a cross sectional view illustrating an intermediate board according to a ninth embodiment of the present invention.

Referring to FIG. 19, the intermediate board 1000 of FIG. 19 is an example of an embodiment wherein the laminated capacitor of the sub-core portion 1 in the intermediate board 200 of FIG. 4 comprises a ceramic board 11. In the sub-core portion (ceramic board) 11, a commercially available ceramic green sheet which contains a material powder of the ceramic (a glass ceramic is preferably used in this embodiment) and via holes formed by punching, laser boring or the like and filled with metal powder paste are laminated and calcined. As a result, the sub-core conductors 51a and 51b are each formed as a laminated via.

Although the invention has been described above in relation to preferred embodiments thereof, it will be understood by those skilled in the art that variations and modifications can be effected in these preferred embodiments without departing from the scope and spirit of the invention.

What is claimed is:
1. A wiring board, comprising:
  a wiring board main body including a capacitor housing portion;
  a capacitor housed in the capacitor housing portion and comprising at least part of a sub-core portion, said capacitor comprising a first electrode conductor layer; a second electrode conductor layer opposed to the first electrode conductor layer; and a dielectric layer disposed between the first electrode conductor layer and the second electrode conductor layer, said capacitor including, at an outer peripheral edge, at least one of (i) a chamfered portion with a chamfering dimension of not less than 0.6 mm and (ii) a radius portion having a radius of curvature of not less than 0.6 mm;
  wherein the dielectric layer has a linear coefficient of expansion smaller than the linear coefficient of expansion of the wiring board, and larger than the linear coefficient of expansion of a semiconductor board of a semiconductor chip to be mounted on the wiring board; and
  wherein said capacitor has a dimension larger than that of the chamfered portion, and said first electrode layer and second electrode layer are exposed on an outer peripheral surface of the capacitor.

2. A wiring board according to claim 1, wherein the capacitor includes said chamfering portion and the chamfering dimension of the chamfered portion is between 0.8 mm and 1.2 mm.

3. A wiring board according to claim 1, wherein the capacitor includes said radius portion and the radius of curvature of the radius portion is between 0.8 mm and 1.2 mm.

4. A wiring board according to claim 1, wherein the capacitor includes the chamfered portion wherein the chamfered portion comprises a plurality of chamfered portions formed at a plurality of locations, and wherein at least one of the chamfered portions has a different chamfering dimension from that of the other chamfered portions.

5. A wiring board according to claim 1, wherein the capacitor includes said radius portion, wherein said radius portion comprises a plurality of radius portions formed at a plurality of locations, and wherein one of the radius portions has a different radius of curvature from that of the other radius portions.

* * * * *